(12) United States Patent
Watanabe et al.

(10) Patent No.: US 9,297,838 B2
(45) Date of Patent: Mar. 29, 2016

(54) POWER SUPPLY MONITORING CIRCUIT, AC/DC CONVERSION APPARATUS AND CONTROL METHOD OF POWER SUPPLY MONITORING CIRCUIT

(71) Applicant: Sony Corporation, Tokyo (JP)

(72) Inventors: Hiroyuki Watanabe, Kanagawa (JP); Mitsuru Yamane, Saitama (JP)

(73) Assignee: SONY CORPORATION, Tokyo (JP)

(*) Notice: Subject to any disclaimer, the term of this patent is extended or adjusted under 35 U.S.C. 154(b) by 448 days.

(21) Appl. No.: 13/945,128

(22) Filed: Jul. 18, 2013

(65) Prior Publication Data

US 2014/0036559 A1    Feb. 6, 2014

(30) Foreign Application Priority Data

Aug. 2, 2012    (JP) ................... 2012-171700

(51) Int. Cl.

| | |
|---|---|
| H02M 7/217 | (2006.01) |
| G01R 19/00 | (2006.01) |
| H02M 7/04 | (2006.01) |
| H02M 1/36 | (2007.01) |
| H02M 1/42 | (2007.01) |
| G01R 31/40 | (2014.01) |

(52) U.S. Cl.
CPC ............... *G01R 19/00* (2013.01); *G01R 31/40* (2013.01); *H02M 1/36* (2013.01); *H02M 1/4225* (2013.01); *H02M 7/04* (2013.01); *Y02B 70/126* (2013.01)

(58) Field of Classification Search
CPC .................................................. H02M 7/217
USPC .................................................... 363/84, 89
See application file for complete search history.

(56) References Cited

U.S. PATENT DOCUMENTS

| | | | | |
|---|---|---|---|---|
| 4,092,711 A | * | 5/1978 | Gerding | H02M 3/3387 363/53 |
| 5,258,901 A | * | 11/1993 | Fraidlin | H02J 9/061 307/64 |
| 6,504,497 B2 | * | 1/2003 | Jang | H02J 7/345 341/125 |
| 8,379,421 B2 | * | 2/2013 | Nishijima | H02M 1/4208 323/207 |
| 2003/0035311 A1 | * | 2/2003 | Phadke | H02H 9/001 363/89 |
| 2013/0070497 A1 | * | 3/2013 | Liquicia | H02M 1/32 363/126 |
| 2013/0147440 A1 | * | 6/2013 | Shiroyama | G01R 31/40 320/166 |
| 2013/0164016 A1 | * | 6/2013 | Inukai | G03G 15/80 399/88 |
| 2013/0195497 A1 | * | 8/2013 | Shimura | G03G 15/80 399/88 |
| 2014/0036559 A1 | * | 2/2014 | Watanabe | G01R 19/00 363/84 |

FOREIGN PATENT DOCUMENTS

JP    2010-261862    11/2010

* cited by examiner

*Primary Examiner* — Jeffrey Sterrett
(74) *Attorney, Agent, or Firm* — Michael Best & Friedrich LLP

(57) ABSTRACT

There is provided a power supply monitoring circuit including a holding part holding, every time a local maximum value of a power supply voltage which fluctuates is detected, the local maximum value as a local maximum voltage value, a power stop detector detecting whether or not supply of the power supply voltage is stopped based on whether or not a state that a value of the power supply voltage is smaller than a first reference value according to the local maximum voltage value continues longer than a predetermined period, and a reference value controller decreasing the first reference value during a period in which the value of the power supply voltage exceeds a second reference value smaller than the first reference value and in which stop of the supply of the power supply voltage is detected.

9 Claims, 17 Drawing Sheets a b c a b

POWER SUPPLY MONITORING CIRCUIT, AC/DC CONVERSION APPARATUS AND CONTROL METHOD OF POWER SUPPLY MONITORING CIRCUIT

BACKGROUND

The present technology relates to a power supply monitoring circuit, an AC/DC conversion apparatus and a control method of a power supply monitoring circuit and specifically relates to a power supply monitoring circuit, an AC/DC conversion apparatus and a control method of a power supply monitoring circuit detecting supply stop of AC power.

An AC/DC (Alternating Current/Direct Current) converter is generally used for supplying AC power to electronic equipment operating with direct current. The AC/DC converter converts alternating current into direct current using a PFC (Power Factor Control) circuit and the like containing a block capacitor with large capacity. When power supply from the AC power supply is stopped due to blackout or the like, the electronic equipment as the supply destination is supplied with power for a certain period using energy accumulated in the block capacitor and the like. In case where the electronic equipment as the supply destination should perform shutdown processing and the like in its termination of operation, when supply stop of power from the AC power supply is detected, the AC/DC converter outputs the detection signal to the electronic equipment. According to the detection signal, the electronic equipment can perform the shutdown processing until the power supply from the AC/DC converter is completely stopped. The faster the supply stop of the power is detected by the AC/DC converter, the earlier the shutdown processing starts, this enabling to reduce time during which the AC/DC converter should continue the power supply. The shorter the time during which the power supply should be continued is, the smaller the capacity of the block capacitor or the like has to be. Therefore, the supply stop of the AC power is desirable to be detected quickly.

In order to detect supply stop of AC power, for example, a power supply apparatus is proposed which performs full-wave rectification on alternating current to generate a pulsating flow, holds the peak voltage of the pulsating flow in a capacitor and compares voltage of the pulsating flow with a reference voltage as a voltage obtained by voltage-division on the peak voltage (for example, see Japanese Patent Laid-Open No. 2010-261862). The power supply apparatus detects the supply stop of AC power when the state that the voltage of the pulsating flow is lower than the reference voltage continues longer than a predetermined time.

The capacitor, however, continuing to hold the peak voltage still after the supply stop of the power results in the power supply apparatus determining the supply stop of AC power for a long period even when the amplitude of the voltage of the pulsating flow merely declines without stop of the power supply. This is hereinafter referred to as "misdetection". Therefore, upon the supply stop of AC power, such a power supply apparatus performs forced discharge on the capacitor which holds the peak voltage to shorten a period of the misdetection of supply stop of AC power.

SUMMARY

The above-mentioned power supply apparatus, however, has a risk of delayed detection of the supply stop of AC power. Namely, there is a risk of no detection of the supply stop of AC power when the decrease rate of the peak voltage exceeds the decrease rate of the voltage of the pulsating flow in forced discharge of the capacitor which holds the peak voltage, the decrease causing the voltage of the pulsating flow to be equal to or greater than the reference voltage. Although supply stop of AC power is detected eventually when the voltage of the pulsating flow is further decreased to be smaller than the reference voltage, the supply stop of AC power results in delayed detection compared with a case without the forced discharge. As mentioned above, without the forced discharge, supply stop of AC power is subject to misdetection for a longer period when the amplitude of the pulsating flow declines, this disabling to monitor the AC power supply accurately. Accordingly, the above-mentioned power supply apparatus has the problem that it is difficult to detect supply stop of AC power accurately and quickly.

The present technology is achieved by taking such a circumstance into consideration and it is desirable to detect supply stop of AC power accurately and quickly.

According to a first embodiment of the present technology, there is provided a power supply monitoring circuit and a control method thereof. The power supply monitoring circuit includes a holding part holding, every time a local maximum value of a power supply voltage which fluctuates is detected, the local maximum value as a local maximum voltage value, a power stop detector detecting whether or not supply of the power supply voltage is stopped based on whether or not a state that a value of the power supply voltage is smaller than a first reference value according to the local maximum voltage value continues longer than a predetermined period, and a reference value controller decreasing the first reference value during a period in which the value of the power supply voltage exceeds a second reference value smaller than the first reference value and in which stop of the supply of the power supply voltage is detected. Thereby, the first reference value can be decreased during a period when the value of the power supply voltage is larger than the second reference value and the supply stop of the power supply voltage is detected.

According to the first embodiment of the present technology, the holding part may include a capacitor holding the local maximum voltage value, and the reference value controller may decrease the first reference value by discharging the capacitor. Thereby, the first reference value can be decreased due to the discharge of the capacitor.

According to the first embodiment of the present technology, the first reference value may be a value at which a ratio relative to the local maximum voltage value is a first ratio, and the second reference value may be a value at which a ratio relative to the local maximum voltage value is a second ratio smaller than the first ratio. Thereby, the first reference value can be a value at which a ratio relative to the above-mentioned local maximum voltage value is the first ratio and the second reference value can be a value at which a ratio relative to the local maximum voltage value is the second ratio smaller than the first ratio.

According to the first embodiment of the present technology, the power stop detector may include a power stop detection comparator comparing the value of the power supply voltage with the first reference value to output a result of the comparison as a first comparison result, and a power stop detection circuit detecting whether or not the supply of the power supply voltage is stopped based on whether or not an output of the first comparison result indicating that the value of the power supply voltage is smaller than the first reference value continues longer than the predetermined period. Thereby, whether or not the supply of the power supply voltage is stopped can be detected based on whether or not the output of the first comparison result indicating that the value of the power supply voltage is smaller than the first reference value continues longer than a predetermined period.

According to the first embodiment of the present technology, the reference value controller may include a local maximum voltage value control comparator comparing the value of the power supply voltage with the second reference value to output a result of the comparison as a second comparison result, and a reference value control circuit decreasing the first reference value during a period in which the second comparison result indicating that the value of the power supply voltage is larger than the second reference value is outputted and in which the stop of the supply of the power supply voltage is detected. Thereby, the first reference value can be decreased during a period when the second comparison result indicating that the value of the power supply voltage is larger than the second reference value is outputted and the supply stop of the power supply voltage is detected.

According to the first embodiment of the present technology, the holding part may include a register holding the local maximum voltage value, and a local maximum voltage value controller may decrease the first reference value by decreasing the local maximum voltage value read out from the register to update the register with the decreased local maximum voltage value. Thereby, the local maximum voltage value can be decreased due to the update of the register.

According to the first embodiment of the present technology, the reference value controller may decrease the first reference value during a period in which the local maximum voltage value is smaller than a predetermined threshold or a period in which the value of the power supply voltage is larger than the second reference value and in which the stop of the supply of the power supply voltage is detected. Thereby, the first reference value can be decreased during a period when the local maximum voltage value is smaller than a predetermined threshold or a period when the value of the power supply voltage is larger than the second reference value and the supply stop of the power supply voltage is detected.

According to a second embodiment of the present technology, there is provided an AC/DC conversion apparatus including a rectifier circuit generating a pulsating flow signal by rectifying an AC signal, a holding part holding, every time a local maximum value of a power supply voltage as a voltage of the pulsating flow signal is detected, the local maximum value as a local maximum voltage value, a power stop detector detecting whether or not supply of the power supply voltage is stopped based on whether or not a state that a value of the power supply voltage is smaller than a first reference value according to the local maximum voltage value continues longer than a predetermined period, and a reference value controller decreasing the first reference value during a period in which the value of the power supply voltage exceeds a second reference value smaller than the first reference value and in which stop of the supply of the power supply voltage is detected. Thereby, the first reference value can be decreased during a period when the value of the power supply voltage is larger than the second reference value and the supply stop of the power supply voltage is detected.

According to the present technology, an excellent effect can be realized to detect supply stop of AC power accurately and quickly.

DETAILED DESCRIPTION OF THE EMBODIMENT(S)

Figure 1:
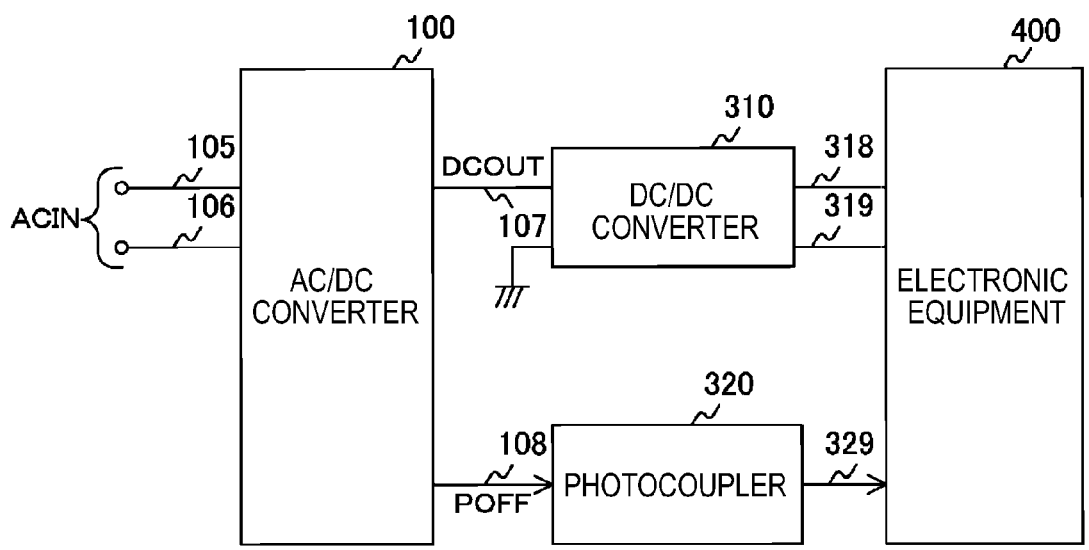
FIG. 1 is an overall diagram illustrating one exemplary configuration of an electronic equipment system according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted. The description is made in the following order.

1. FIRST EMBODIMENT (Example of Decreasing Peak Value Held in Capacitor to Detect Power Supply Stop)

2. SECOND EMBODIMENT (Example of Decreasing Peak Value Held in Register to Detect Power Supply Stop)

3. THIRD EMBODIMENT (Example of Decreasing Peak Value Held in Capacitor and Comparing Power Supply Voltage with Lowest Operation Voltage to Detect Power Supply Stop)

4. VARIATION

1. First Embodiment

[Configuration Example of Power Supply System]

FIG. 1 is an overall diagram illustrating one exemplary configuration of an electronic equipment system according to a first embodiment. The electronic equipment system includes an AC/DC converter 100, a DC/DC converter 310, a photocoupler 320 and electronic equipment 400.

The AC/DC converter 100 converts an AC signal ACIN into a DC signal DCOUT. The AC/DC converter is supplied with the AC signal ACIN via signal lines 105 and 106, for example, connected to an outlet or the like. The AC signal ACIN is an AC signal supplied, for example, from a power supply considered also for oversea usage, so-called, a world-wide power supply. Specifically, the AC signal ACIN is a sinusoidal AC signal with a voltage from 85 to 264 volts (V) and a frequency from 47 to 63 hertz (Hz). In addition, the supplied AC signal ACIN may be an AC signal with wider voltage range and/or frequency range than the AC signal from the world-wide power supply, or may be an AC signal with those narrower than that, for example, an AC signal from a commercial power supply. The AC/DC converter 100 outputs the converted DC signal DCOUT to the DC/DC converter 310 via a signal line 107.

Moreover, the AC/DC converter 100 includes, as necessary, a PFC (Power Factor Correction) function of rectifying a current waveform into a sinusoidal wave.

Moreover, the AC/DC converter 100 detects whether or not the supply of the AC signal ACIN is stopped due to the AC cable plugged off the outlet, blackout or the like, and generates a power stop detection signal POFF indicating the detection result. The power stop detection signal POFF is set, for example, at the low level in case of detection of supply stop of the AC power, and is set at the high level in the other case. The AC/DC converter 100 outputs the power stop detection signal POFF to the photocoupler 320 via a signal line 108. Then, in the case of the supply stop of the power, the AC/DC converter 100 continues to supply the DC signal DCOUT to the electronic equipment 400. The length of the period is a length sufficient for completing shutdown processing of the electronic equipment 400. The shutdown processing is processing to be performed by the electronic equipment 400 before its termination of operation such as processing of closing files in process and processing of saving the content of a memory in a disk. In addition, the AC/DC converter is one example of an AC/DC conversion apparatus according to an embodiment of the present disclosure.

The DC/DC converter 310 converts the voltage of the DC signal DCOUT (for example, 100 V) into a voltage allowed by the electronic equipment 400 (for example, 12 V). The DC/DC converter 310 outputs the DC signal DCOUT with the converted voltage to the electronic equipment 400 via signal lines 318 and 319.

The photocoupler 320 delivers the power stop detection signal POFF to the electronic equipment 400 via a signal line 329. The photocoupler 320 includes a light-emitting element and a light-receiving element, converts the power stop detection signal POFF into an optical signal using the light-emitting element, and converts the optical signal using the light-receiving element into an electric signal which is to be outputted. Thereby, since the input/output terminals of the photocoupler 320 are electrically insulated from each other, the AC/DC converter that is expected to be insulated can also deliver the power stop detection signal POFF to the electronic equipment 400.

The electronic equipment 400 is equipment operating using the DC signal DCOUT from the AC/DC converter 100. Specifically, the electronic equipment 400 is such as a game machine and a television receiver. Moreover, in its operation, upon receiving the power stop detection signal POFF at the low level via the photocoupler 320, the electronic equipment 400 performs predetermined shutdown processing.

[Configuration Example of AC/DC Converter]

Figure 2:
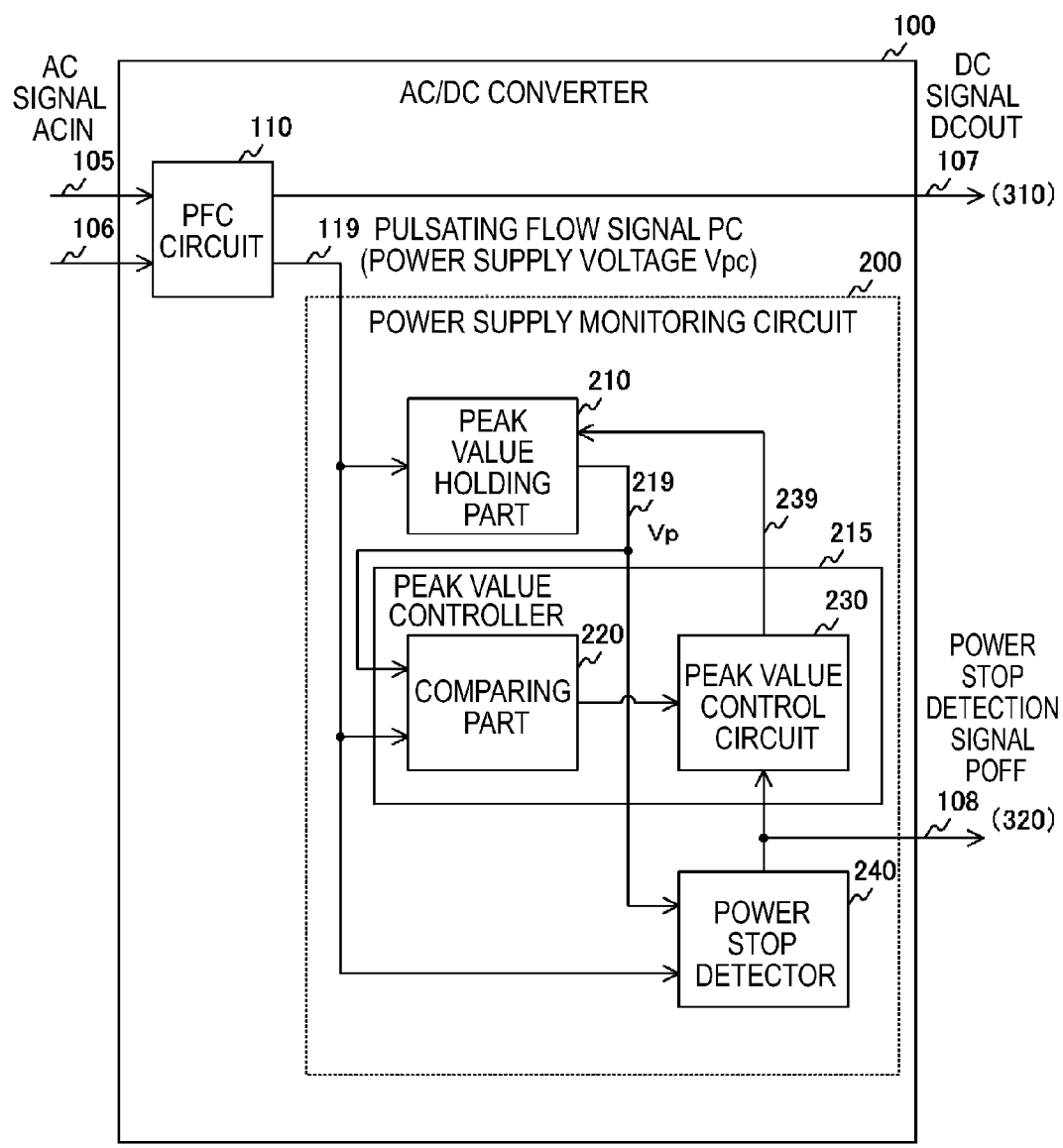
FIG. 2 is a block diagram illustrating one exemplary configuration of an AC/DC converter according to the first embodiment.

FIG. 2 is a block diagram illustrating one exemplary configuration of the AC/DC converter 100 according to the first embodiment. This AC/DC converter 100 includes a PFC circuit 110 and a power supply monitoring circuit 200.

The PFC circuit 110 improves the power factor of the AC signal ACIN, and in addition, rectifies the AC signal ACIN to generate a pulsating flow signal PC and generates the DC signal DCOUT from the pulsating flow signal PC. The PFC circuit 110 outputs the DC signal DCOUT to the DC/DC converter 310 and outputs the pulsating flow signal PC to the power supply monitoring circuit 200 via a signal line 119.

The power supply monitoring circuit 200 monitors a power supply voltage Vpc which is the voltage of the pulsating flow signal PC to detect whether or not supply of the pulsating flow signal PC is stopped. The power supply monitoring circuit 200 includes a peak value holding part 210, a peak value controller 215 and a power stop detector 240. In addition, the power supply monitoring circuit 200 regards the pulsating flow signal PC as the monitoring object, whereas any signal other than the pulsating flow signal PC may be the monitoring object as long as its voltage fluctuates. For example, the power supply monitoring circuit 200 may regard the AC signal ACIN before rectification as the monitoring object.

Every time the local maximum value of the power supply voltage Vpc is detected, the peak value holding part 210 holds the local maximum value as a peak value Vp. In addition, the peak value holding part 210 is one example of a holding part according to an embodiment of the present disclosure.

The power stop detector 240 detects the presence or absence of power supply based on the value of the power supply voltage Vpc and the peak value Vp. Specifically, in case where the state that the value of the power supply voltage Vpc is smaller than a reference value Vref_1 according to the peak value Vp continues longer than a predetermined period, the power stop detector 240 detects the supply stop of AC power, and in the other case, it detects the supply of the power. Then, the power stop detector 240 outputs the power stop detection signal POFF indicating the detection result of the presence or absence of power supply to the peak value controller 215 and the photocoupler 320.

The peak value controller 215 decreases the peak value Vp during a period when the value of the power supply voltage Vpc is larger than a reference value Vref_2 and the supply stop of AC power is being detected, and thereby, decreases the reference value Vref_1. Herein, the reference value Vref_2 is a value according to the peak value Vp and a value smaller than the reference value Vref_1. The peak value controller 215 includes a comparing part 220 and a peak value control circuit 230. In addition, the peak value controller 215 is one example of a reference value controller according to an embodiment of the present disclosure.

The comparing part 220 compares the reference value Vref_2 with the value of the power supply voltage Vpc to output the comparison result to the peak value control circuit 230. The peak value control circuit 230 decreases the peak value held in the peak value holding part 210 during the period when the value of the power supply voltage Vpc is larger than the reference value Vref_2 and the supply stop of AC power is being detected, and thereby, decreases the reference value Vref_1.

By the peak value controller 215 decreasing the reference value Vref_1 in the supply stop of AC power, a period when the supply stop of AC power is subject to misdetection in supplying the power supply voltage Vpc becomes short. For example, in case where the amplitude of the power supply voltage Vpc declines suddenly, when the peak value holding part 210 holds the peak value Vp before the decline, there is sometimes a case where supply stop of the power supply voltage Vpc is detected, this caused by the period when the power supply voltage Vpc is smaller than the reference value Vref_1 along with the decline of the amplitude becoming long. In this case, until the peak value holding part 210 detects a peak value equal to the amplitude after the decline, the power stop detector 240 continues to detect the supply stop of the power supply voltage Vpc. However, the peak value controller 215 decreases the peak value to decrease the reference value Vref_1, and thereby, a period until the peak value holding part 210 detects the peak value equal to the amplitude after the decline becomes short. As a result, a period when the supply stop of AC power is subject to misdetection in supplying the power supply voltage Vpc becomes short.

Moreover, by the peak value controller 215 not decreasing the reference value Vref_1 in case where the reference value Vref_2 is equal to or smaller than the value of the power supply voltage Vpc, a detection rate of supply stop of the power supply voltage Vpc is improved. For example, after the detection of the supply stop of AC power, when the reference value Vref_1 is continuously decreased at a rate faster than a decline rate of the power supply voltage Vpc, there is sometimes a case where the power supply voltage Vpc is equal to or greater than the reference value Vref_1. In this case, the power stop detector 240 results in detection of no supply stop of the power supply voltage Vpc. However, when the reference value Vref_2 smaller than the reference value Vref_1 is equal to or smaller than the value of the power supply voltage Vpc, the peak value controller 215 does not decrease the reference value Vref_1, and thereby, the power supply voltage Vpc can be prevented to be equal to or greater than the reference value Vref_1. As a result, during the supply stop of the power supply voltage Vpc, detection of no supply stop of the power supply voltage Vpc can be prevented and the detection rate of the supply stop of the power can be fast.

[Configuration Example of PFC Circuit]

Figure 3:
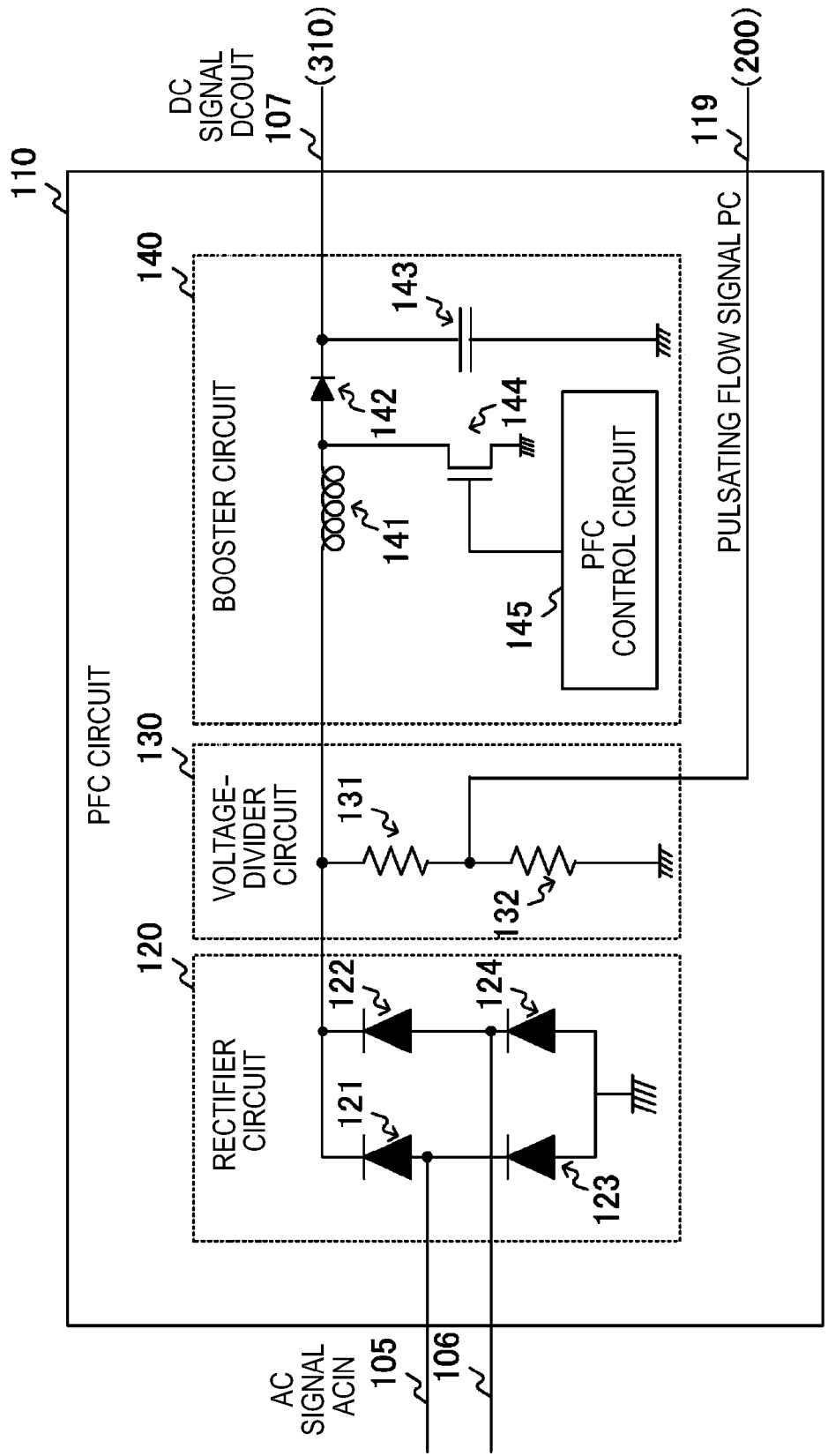
FIG. 3 is a circuit diagram illustrating one exemplary configuration of a PFC circuit according to the first embodiment.

FIG. 3 is a circuit diagram illustrating one exemplary configuration of the PFC circuit 110 according to the first embodiment. This PFC circuit 110 includes a rectifier circuit 120, a voltage-divider circuit 130 and a booster circuit 140.

The rectifier circuit 120 performs full-wave rectification on the AC signal ACIN. The rectifier circuit 120 includes diodes 121 and 122 which are elements performing rectification. The anodes of diodes 123 and 124 are connected to a reference potential. The cathode of the diode 123 is connected to the signal line 105 and the anode of the diode 121, and the cathode of the diode 124 is connected to the signal line 106 and the anode of the diode 122. Moreover, the cathodes of the diodes 121 and 122 are connected to the voltage-divider circuit 130 and booster circuit 140.

In such a configuration, the AC signal ACIN undergoes full-wave rectification. Specifically, in a cycle on one of the positive side and the negative side of the AC signal ACIN, the signal flows in the forward direction of the diodes 121 and 123 therethrough, and in the other cycle, the signal flows in the forward direction of the diodes 122 and 124 therethrough. As a result, the waveforms on both of the positive side and the negative side are rectified and a pulsating flow signal is generated.

In addition, the rectifier circuit 120 performs full-wave rectification on the AC signal ACIN, whereas half-wave rectification on the AC signal ACIN may generate the pulsating flow signal.

The voltage-divider circuit 130 divides the voltage of the pulsating flow signal rectified by the rectifier circuit 120 to output as the pulsating flow signal PC to the power supply monitoring circuit 200 via the signal line 119. The voltage-divider circuit 130 includes resistors 131 and 132. The resistors 131 and 132 are connected in series between the cathodes of the diodes 121 and 122 and the reference potential. Moreover, the signal line 119 is connected to the connection node of the resistors 131 and 132. The resistors 131 and 132 divide the voltage of the pulsating flow signal. Each of the resistance values of the resistors 131 and 132 is set such that the voltage of the pulsating flow signal PC is within a voltage range allowed by the power supply monitoring circuit 200.

The booster circuit 140 performs boosting on the voltage of the pulsating flow signal to generate the DC signal DCOUT. The booster circuit 140 includes a choking coil 141, a diode 142 and a block capacitor 143. One end of the choking coil 141 is connected to the voltage-divider circuit 130 and the other end is connected to the anode of the diode 142 and the source terminal of a PFC control transistor 144. Moreover, one end of the block capacitor 143 is connected to the reference potential and the other end is connected to the cathode of the diode 142 and the signal line 107. The PFC control transistor 144 is a switching element operating according to control of a PFC control circuit 145 and, for example, the PFC control transistor 144 employs an n-type MOS (Metal-Oxide-Semiconductor) transistor. The source terminal of the PFC control transistor 144 is connected to the choking coil 141 and diode 142 and the drain terminal thereof is connected to the reference potential. Moreover, the gate terminal of the PFC control transistor 144 is connected to the PFC control circuit 145.

The PFC control circuit 145 controls the PFC control transistor 144 such that the current waveform of the AC signal ACIN is a waveform similar to the voltage waveform of the AC signal ACIN (for example, a sinusoidal wave). For example, the PFC control circuit 145 turns ON and OFF the PFC control transistor 144 at a frequency higher than the frequency of the AC signal ACIN. At this stage, the PFC control circuit 145 controls ON time and OFF time of the PFC control transistor 144 such that the current waveform is a sinusoidal wave, based on information of the input voltage (voltage of the pulsating flow signal) and the output voltage (voltage of the block capacitor 143). Thereby, the current waveform is formed into a sinusoidal wave and the DC signal DCOUT is generated from the pulsating flow signal. Forming the current waveform into a sinusoidal wave enables to improve the power factor of the AC power supply, and thus, to suppress the higher harmonic wave in the AC signal ACIN. In addition, the configuration of the PFC circuit 110 is not limited to the configuration exemplarily illustrated in FIG. 3 as long as a function of improving the power factor can be realized.

When the supply of the AC signal ACIN is stopped, the AC/DC converter 100 can continue to supply the DC signal DCOUT due to discharge of the power which is charged in the block capacitor 143 for a period according to the capacity of the block capacitor 143. As mentioned above, this period should be a sufficient time for completing the shutdown processing of the electronic equipment 400. Therefore, the larger capacity of the block capacitor 143 is better, while the size and cost of the block capacitor 143 largely occupies those of the components of the AC/DC converter 100, and thus, it is also desirable to reduce the capacity of the block capacitor 143. In order to reduce the capacity of the block capacitor 143, the supply stop of the AC signal ACIN should be detected in a short time and the time until the electronic equipment 400 starts the shutdown processing should be short.

In addition, the PFC circuit 110 may have no voltage-divider circuit 130. In this case, the pulsating flow current from the rectifier circuit 120 is outputted to the power supply monitoring circuit 200 as the pulsating flow signal PC as it is. In this case, the power supply monitoring circuit 200 further includes a current-voltage conversion circuit converting the pulsating flow current into a voltage, and detects supply stop of the voltage after the conversion.

[Configuration Example of Power Supply Monitoring Circuit]

Figure 4:
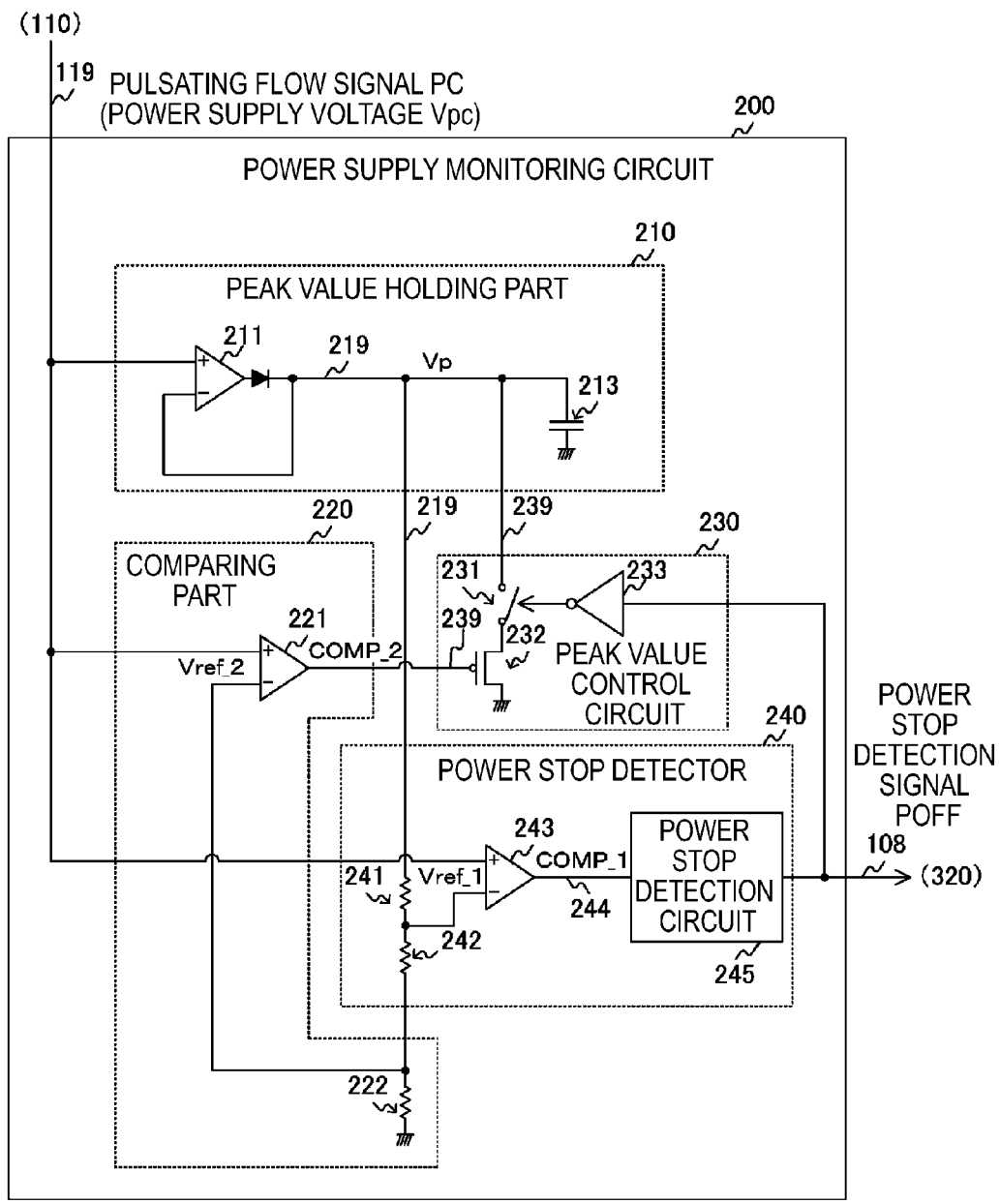
FIG. 4 is a circuit diagram illustrating one exemplary configuration of a power supply monitoring circuit according to the first embodiment.

FIG. 4 is a circuit diagram illustrating one exemplary configuration of the power supply monitoring circuit 200 according to the first embodiment. In this power supply monitoring circuit 200, the peak value holding part 210 includes a buffer amplifier 211 and a peak value holding capacitor 213. Moreover, the comparing part 220 includes a comparator 221 and a resistor 222. The peak value control circuit 230 includes a switch 231, a discharge control transistor 232 and an inverter 233. The power stop detector 240 includes resistors 241 and 242, a comparator 243 and a power stop detection circuit 245.

The buffer amplifier 211 in the peak value holding part 210 outputs the peak voltage of a signal inputted in its non-inversion input terminal. The non-inversion input terminal of the buffer amplifier 211 is connected to the signal line 119.

Moreover, the output terminal of the buffer amplifier 211 is connected to the inversion input terminal of the buffer amplifier 211, the resistor 241, the switch 231 and the peak value holding capacitor 213 via the signal line 219.

As above, the current from the output terminal of the buffer amplifier 211 is fed back to the inversion input terminal of the buffer amplifier 211. According to this configuration, the buffer amplifier 211, while does not have the sink ability to allow the output current to flow in transition of the output potential from the high level to the low level, has the source ability to flow the output current in transition of the output potential from the low level to the high level. Accordingly, the buffer amplifier 211 can output the local maximum value of the power supply voltage Vpc inputted in the non-inversion input terminal. This local maximum value is held by the peak value holding capacitor 213 as a peak value.

The comparator 221 in the comparing part 220 compares the voltages of individual signals inputted in its non-inversion input terminal and its inversion input terminal with each other. The signal line 119 is connected to the non-inversion input terminal of the comparator 221 and the terminal on the high-potential side of the resistor 222 is connected to the inversion input terminal thereof. Moreover, the output terminal of the comparator 221 is connected to the gate terminal of the discharge control transistor 232. One end of the resistor 222 is connected to the reference potential and the other end is connected to the inversion input terminal of the comparator 221 and the resistor 242. The resistor 242 and the resistors 241 and 242 mentioned later are connected in series between the reference potential and the terminal on the high-potential side of the peak value holding capacitor 213. In addition, the comparator 221 is one example of a local maximum voltage value control comparator according to an embodiment of the present disclosure.

The potential of the connection node of the resistor 222 and resistor 242 is a potential obtained by voltage-division on the voltage of the peak value Vp by a ratio (for example, 0.6) of the resistance of the resistor 222 relative to the synthesis resistance of the resistors 241, 242 and 222. The value of the potential is used as the reference value Vref_2. Then, the comparator 221 outputs the comparison result of the value of the power supply voltage Vpc inputted in the non-inversion terminal with the reference value Vref_2 inputted in the inversion input terminal to the discharge control transistor 232 as a comparison result COMP_2. Specifically, in case that the value of the power supply voltage Vpc is larger than the reference value Vref_2, the comparison result COMP_2 at the high level is outputted from the comparator 221, and in the other case, the comparison result COMP_2 at the low level is outputted therefrom.

The switch 231 in the peak value control circuit 230 opens and shuts the terminals according to the potential of the power stop detection signal POFF. One end of the switch 231 is connected to the peak value holding capacitor 213 and the other end is connected to the source terminal of the discharge control transistor 232. The switch 231 opens and shuts the terminals according to the output of the inverter 233 inverting the power stop detection signal POFF. For example, when the output of the inverter 233 is at the high level, the switch 231 shuts the terminals, being in the ON state, and when at the low level, it opens the terminals, being in the OFF state. In addition, the peak value control circuit 230 is one example of a local maximum voltage value controller according to an embodiment of the present disclosure.

The discharge control transistor 232 controls the current flowing from its source to its drain according to its gate voltage. The discharge control transistor 232 is, for example, a p-type MOS transistor. The gate terminal of the discharge control transistor 232 is connected to the output terminal of the comparator 221, the source terminal thereof is connected to one end of the switch 231 and the drain terminal thereof is connected to the reference potential. When the comparison result COMP_2 at the low level is outputted from the comparator 221, the discharge control transistor 232 operates in the ON state where the current flows from its source to its drain. On the other hand, when the comparison result COMP_2 at the high level is outputted, the discharge control transistor 232 operates in the OFF state where its source is insulated from its drain.

When the switch 231 and discharge control transistor 232 are in the ON state, the current flows from the peak value holding capacitor 213 to the reference potential. The ON resistance of the discharge control transistor 232 is sufficiently small compared with the synthesis resistance of the resistors 241, 242 and 222. Therefore, the current flowing through the switch 231 and discharge control transistor 232 is larger than the current flowing through the resistors 241, 242 and 222 to the reference potential. Hence, when the switch 231 and discharge control transistor 232 are in the ON state, the discharge rate of the peak value holding capacitor 213 increases. Hereinafter, the discharge of the peak value holding capacitor 213 in this case is referred to as "forced discharge".

As mentioned above, when the supply stop of AC power is detected, the switch 231 is in the ON state, and when the value of the power supply voltage Vpc is larger than the reference value Vref_2, the discharge control transistor 232 is in the ON state. Accordingly, when the supply stop of AC power is detected and the value of the power supply voltage Vpc is larger than the reference value Vref_2, the peak value holding capacitor 213 undergoes the forced discharge.

The comparator 243 compares the voltages of individual signals inputted in its non-inversion input terminal and its inversion input terminal with each other. The signal line 119 is connected to the inversion input terminal of the comparator 243 and the non-inversion input terminal thereof is connected to the connection node of the resistors 241 and 242. Moreover, the output terminal of the comparator 243 is connected to the power stop detection circuit 245 via a signal line 244.

The potential of the connection node of the resistor 241 and resistor 242 is a potential obtained by voltage-division on the voltage of the peak value Vp by a ratio (for example, 0.65) of the synthesis resistance of the resistors 242 and 222 relative to the synthesis resistance of the resistors 241, 242 and 222. The value of the potential is used as a reference value Vref_1.

The comparator 243 outputs the comparison result of the value of the power supply voltage Vpc inputted in its non-inversion terminal with the reference value Vref_1 inputted in its inversion input terminal to the power stop detection circuit 245 as a comparison result COMP_1. Specifically, in case that the value of the power supply voltage Vpc is larger than the reference value Vref_1, the comparison result COMP_1 at the high level is outputted from the comparator 243, and in the other case, the comparison result COMP_1 at the low level is outputted therefrom. In addition, the comparator 243 is one example of a power stop detection comparator according to an embodiment of the present disclosure.

The power stop detection circuit 245 detects whether or not the power supply is stopped based on whether or not the state where the value of the power supply voltage Vpc is equal to or smaller than the reference value Vref_1 continues longer than a predetermined period. Specifically, the power stop detection circuit 245 counts the length of the period when the comparison result COMP_1 from the comparator 243 is at the low level, and when that state continues longer than the predetermined period (for example, 10 milliseconds), outputs the power stop detection signal POFF at the low level. On the other hand, when the period when the comparison result COMP_1 is at the low level is less than a predetermined period, or when the comparison result COMP_1 is at the high level, the power stop detection circuit 245 outputs the power stop detection signal POFF at the high level. The power stop detection signal POFF is outputted to the photocoupler 320 and inverter 233.

[Configuration Example of Power Supply Monitoring Circuit]

Figure 5:
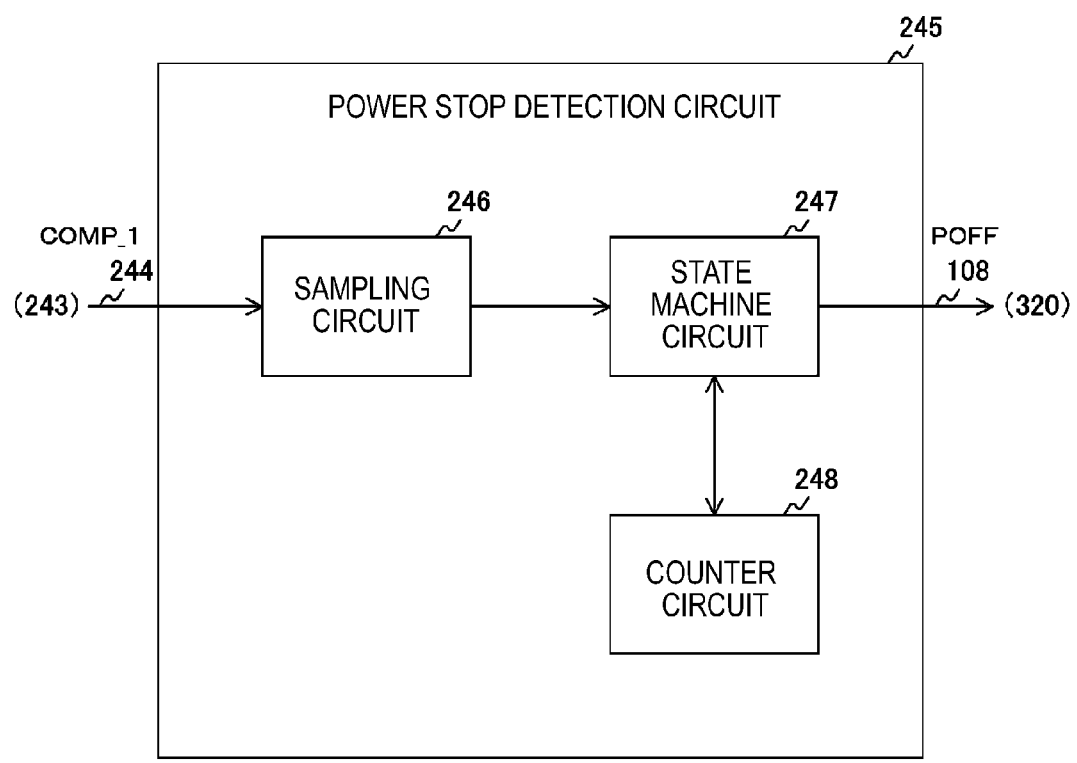
FIG. 5 is a block diagram illustrating one exemplary configuration of a power stop detection circuit according to the first embodiment.

FIG. 5 is a block diagram illustrating one exemplary configuration of the power stop detection circuit 245 according to the first embodiment. This power stop detection circuit 245 includes a sampling circuit 246, a state machine circuit 247 and a counter circuit 248.

The sampling circuit 246 performs sampling of the comparison result COMP_1 to output it to the state machine circuit 247. Moreover, the sampling circuit 246 removes noise convoluted in the comparison result COMP_1 using a digital filter such as a noise filter including a shift register and a circuit determining match or mismatch in each step of the shift register. Thereby, chattering in the comparison result COMP_1 is prevented. In addition, the sampling circuit 246 may have a configuration without a digital filter for noise reduction.

The state machine circuit 247 generates the power stop detection signal POFF based on the comparison result COMP_1. Specifically, the state machine circuit 247 causes the counter circuit 248 to count a period when the comparison result COMP_1 is at the low level. Then, during a period when that state continues longer than a predetermined period (for example, 10 milliseconds), the state machine circuit 247 outputs the power stop detection signal POFF at the low level.

The counter circuit 248 counts the period when the comparison result COMP_1 is at the low level according to the control of the state machine circuit 247.

[Operation Example of Power Supply Monitoring Circuit]

Figure 6:
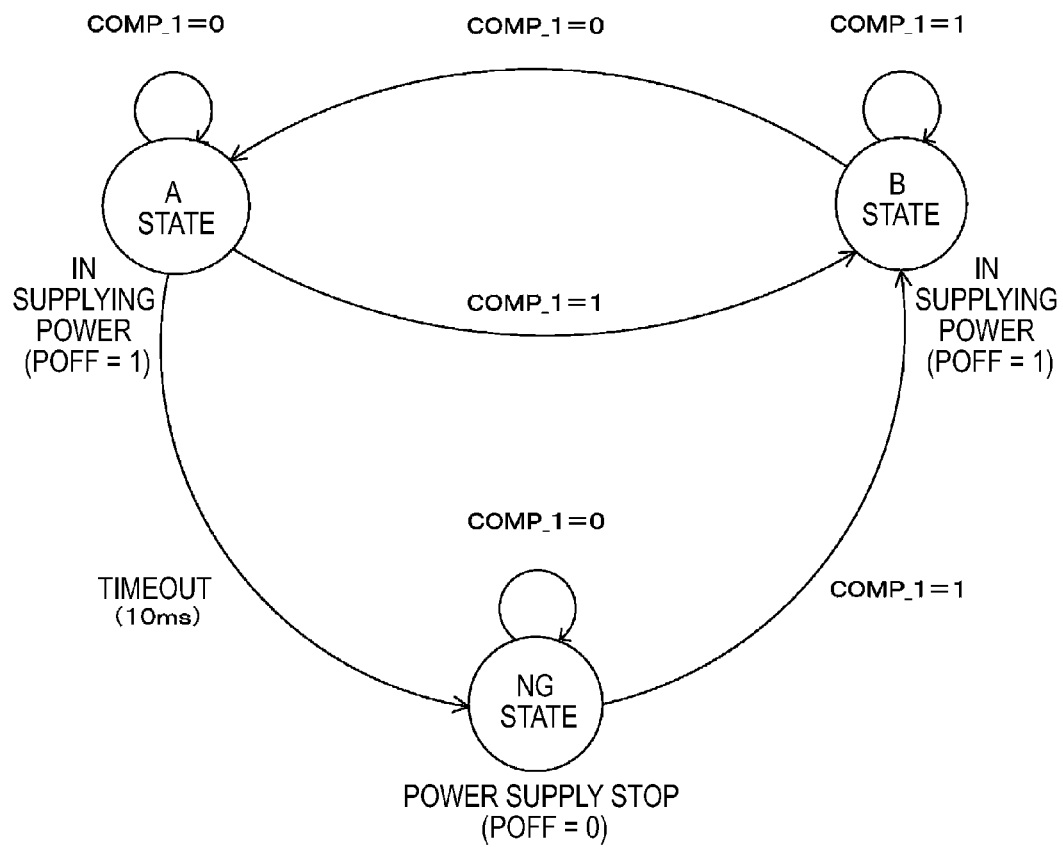
FIG. 6 is a state transition diagram illustrating one example of operation of a state machine circuit according to the first embodiment.

FIG. 6 is a state transition diagram illustrating one example of operation of the state machine circuit 247 according to the first embodiment. In the state machine circuit 247, for example, the A state is set to the initial state, and in the A state, the power stop detection signal POFF is set at the high level, this indicating supplying power.

In the A state, when the comparison result COMP_1 is at the low level, the state machine circuit 247 maintains the A state and causes the counter circuit 248 to count a period when being in the A state. When the comparison result COMP_1 is at the high level, the state machine circuit 247 moves to the B state. Moreover, when the A state continues longer than a predetermined period (for example, 10 milliseconds), that is, in case of timeout, the state machine circuit 247 moves to the NG state.

In the B state, the state machine circuit 247 resets the count value of the counter circuit 248 to the initial value. Moreover, in the B state, the power stop detection signal POFF is set at the high level. When the comparison result COMP_1 is at the high level, the state machine circuit 247 maintains the B state, and when being at the low level, it moves to the A state.

In the NG state, the state machine circuit 247 detects the supply stop of AC power and sets the power stop detection signal POFF to the low level. When the comparison result COMP_1 is at the low level, the state machine circuit 247 maintains the NG state, and when being at the high level, it moves to the B state.

Figure 7:
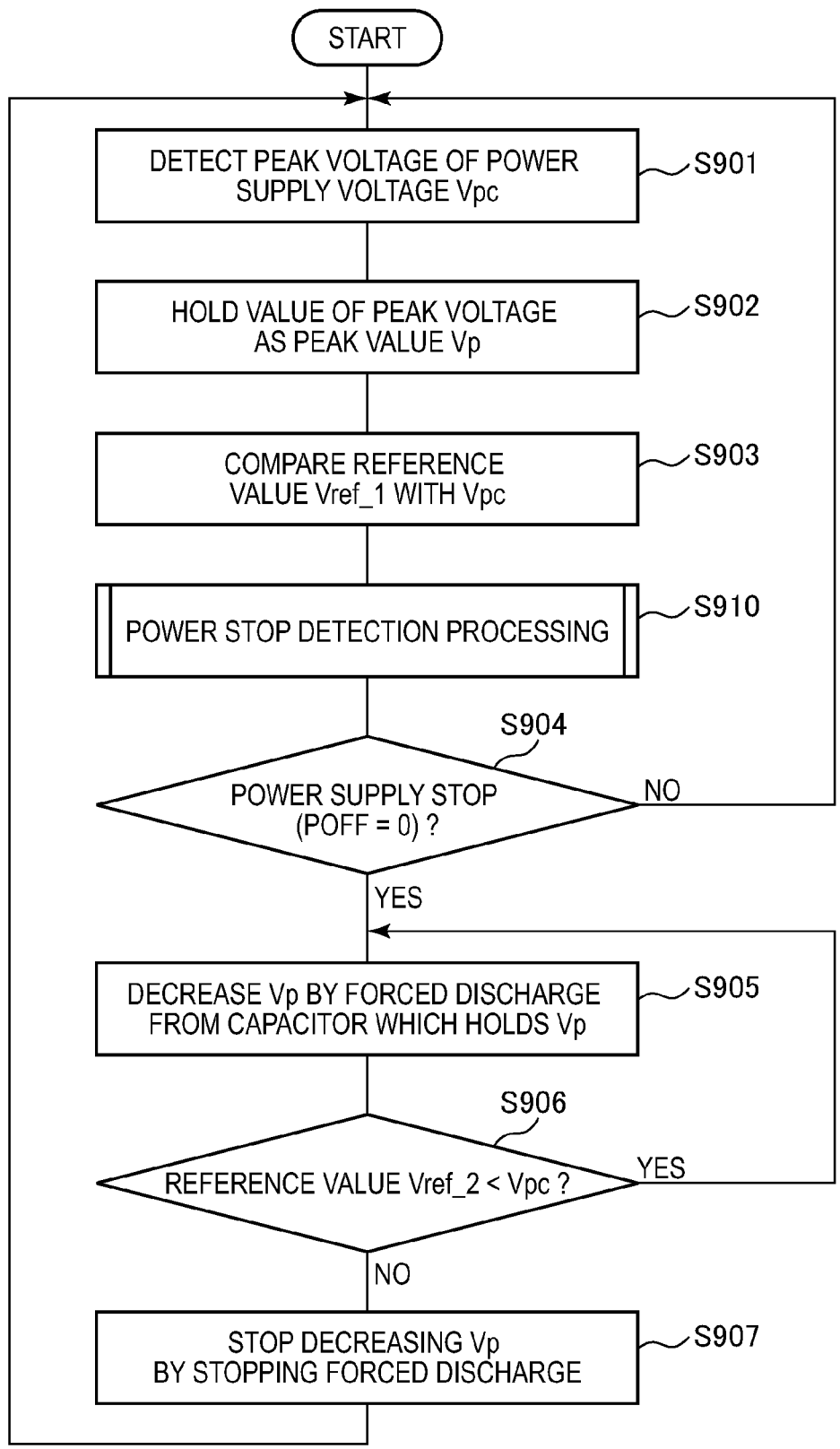
FIG. 7 is a flowchart illustrating one example of operation of the power supply monitoring circuit according to the first embodiment.

FIG. 7 is a flowchart illustrating one example of operation of the power supply monitoring circuit 200 according to the first embodiment. The operation starts, for example, upon starting the supply of the power supply voltage Vpc.

The power supply monitoring circuit 200 detects the peak voltage of the power supply voltage Vpc (step S901). The power supply monitoring circuit 200 holds the detected value of the peak voltage as a peak value Vp (step S902). Then, the power supply monitoring circuit 200 compares the reference value Vref_1 according to the peak value Vp with the power supply voltage Vpc (step S903). The power supply monitoring circuit 200 performs power stop detection processing for detecting whether or not the supply of the power supply voltage Vpc is stopped (step S910).

The power supply monitoring circuit 200 determines whether or not the power stop detection signal POFF is at the low level, that is, whether or not the supply stop of the power supply voltage Vpc is detected (step S904). When any supply stop the power supply voltage Vpc is not detected (step S904: No), the power supply monitoring circuit 200 returns the process to step S901.

When the supply stop of the power supply voltage Vpc is detected (step S904: Yes), the power supply monitoring circuit 200 decreases the peak value Vp by performing forced discharge on the peak value holding capacitor 213 which holds the peak value Vp (step S905). Then, the power supply monitoring circuit 200 determines whether or not the reference value Vref_2 is smaller than the power supply voltage Vpc (step S906). When the reference value Vref_2 is smaller than the power supply voltage Vpc (step S906: Yes), the power supply monitoring circuit 200 returns the process to step S905. On the other hand, when the reference value Vref_2 is equal to or greater than the power supply voltage Vpc (step S906: No), the power supply monitoring circuit 200 stops decreasing the peak value Vp by stopping the forced discharge (step S907). After step S907, the power supply monitoring circuit 200 returns the process to step S901.

Figure 8:
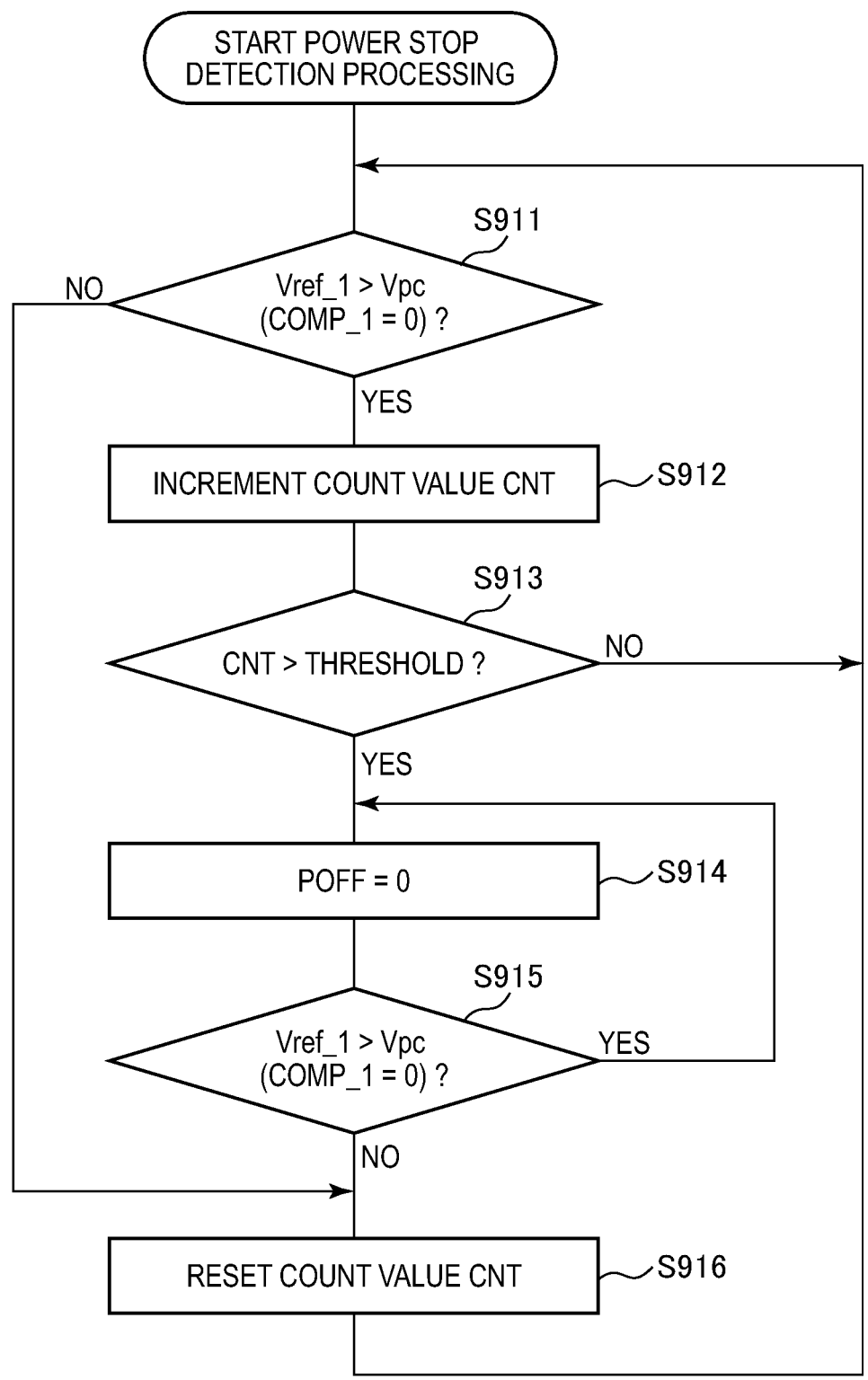
FIG. 8 is a flowchart illustrating one example of power supply detection processing according to the first embodiment.

FIG. 8 is a flowchart illustrating one example of the power supply detection processing according to the first embodiment. The power stop detection circuit 245 determines whether or not the comparison result COMP_1 is at the low level, that is, whether or not the reference value Vref_1 is larger than the value of the power supply voltage Vpc (step 911). When the reference value Vref_1 is larger than the value of the power supply voltage Vpc (step S911: Yes), the power stop detection circuit 245 increments the count value CNT of the counter circuit 248 (step S912). The power stop detection circuit 245 determines whether or not the count value CNT is larger than a predetermined threshold (step S913). When the count value CNT is equal to or smaller than the threshold (step S913: No), the power stop detection circuit 245 returns the process to step S911.

When the count value CNT is larger than the threshold (step S913: Yes), the power stop detection circuit 245 detects the supply stop of AC power and outputs the power stop detection signal POFF that has been set at the low level (step S914). The power stop detection circuit 245 determines whether or not the reference value Vref_1 is larger than the value of the power supply voltage Vpc (step S915). When the reference value Vref_1 is larger than the value of the power supply voltage Vpc (step S915: Yes), the power stop detection circuit 245 returns the process to step S914.

When the reference value Vref_1 is equal to or smaller than the value of the power supply voltage Vpc (step S911 or S915: No), the power stop detection circuit 245 resets the count value CNT to the initial value (step S916). After step S916, the power stop detection circuit 245 returns the process to step S911.

Figure 9:
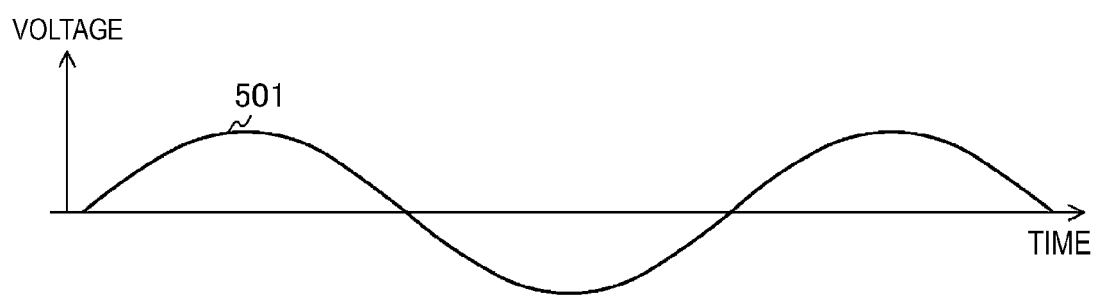
FIG. 9 is a diagram illustrating one example of voltage waveforms of an AC signal according to the first embodiment.
Figure 9:
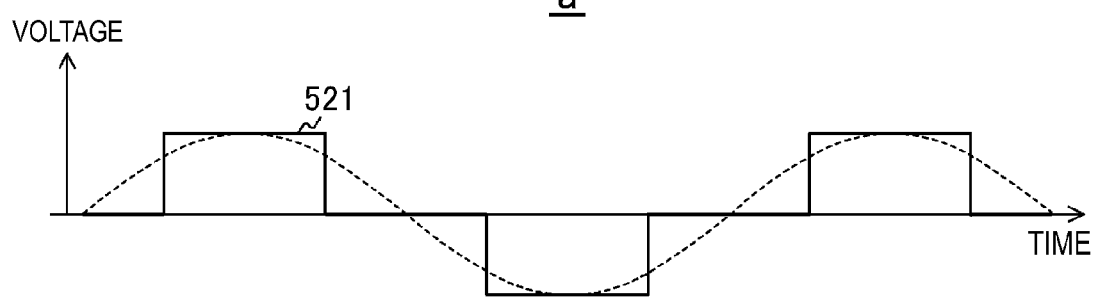
Figure 9:
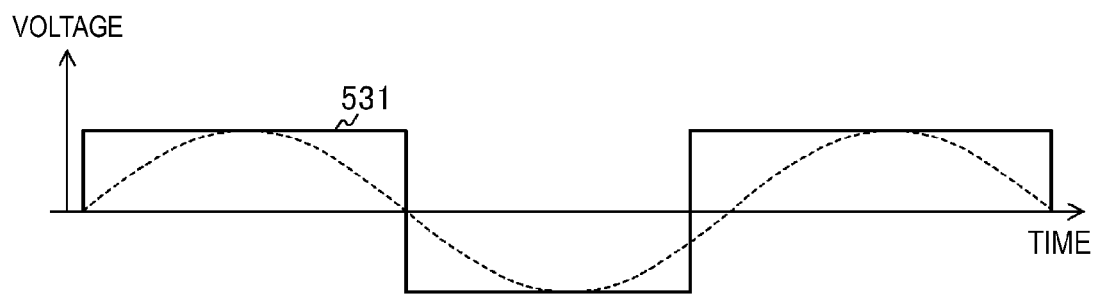

FIG. 9 is a diagram illustrating one example of voltage waveforms of the AC signal ACIN according to the first embodiment. In FIG. 9, the vertical axes represent voltage and the horizontal axes represent time. Portion a in FIG. 9 is one example of a sinusoidal wave 501. Portion b in FIG. 9 is one example of a pseudo-sinusoidal wave 521. Portion c in FIG. 9 is one example of a rectangular wave 531. The voltage waveform of the AC signal ACIN may be any of the waveforms exemplarily illustrated in portions a, b and c of FIG. 9 and the like or may be any other waveform as long as its voltage fluctuates.

Figure 10:
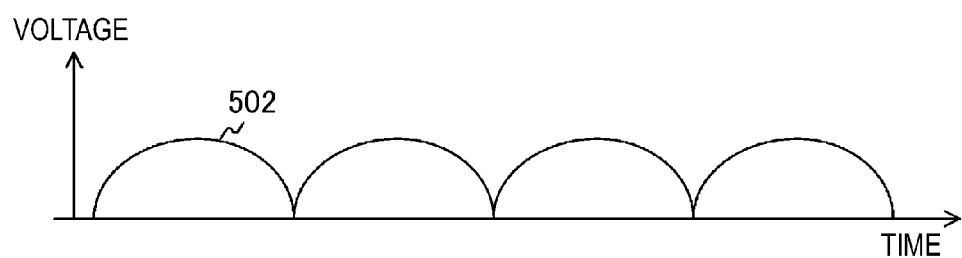
FIG. 10 is a diagram illustrating one example of voltage of a pulsating flow signal and a DC signal according to the first embodiment.
Figure 10:
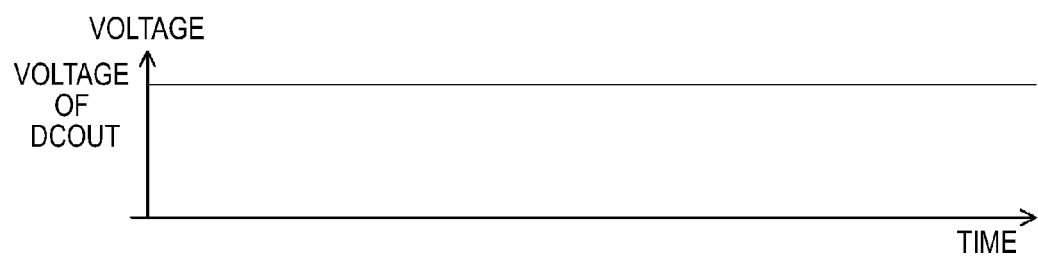

FIG. 10 is a diagram illustrating one example of voltages of a pulsating flow signal PC the DC signal DCOUT according to the first embodiment. In FIG. 10, the vertical axes represent voltage and the horizontal axes represent time. Portion a in FIG. 10 is one example of a pulsating flow signal PC generated by full-wave rectification on the AC signal ACIN with the sinusoidal wave 501 exemplarily illustrated in portion a of FIG. 9. As exemplarily illustrated in portion a of FIG. 10, the full-wave rectification of the sinusoidal wave 502 affords a pulsating flow signal PC whose flowing direction is constant and whose voltage fluctuates periodically.

Portion b in FIG. 10 is one example of a DC signal DCOUT generated by boosting on the pulsating flow signal PC. As exemplarily illustrated in portion b of FIG. 10, a DC signal DCOUT with a constant voltage is obtained from the pulsating flow signal PC.

Figure 11:
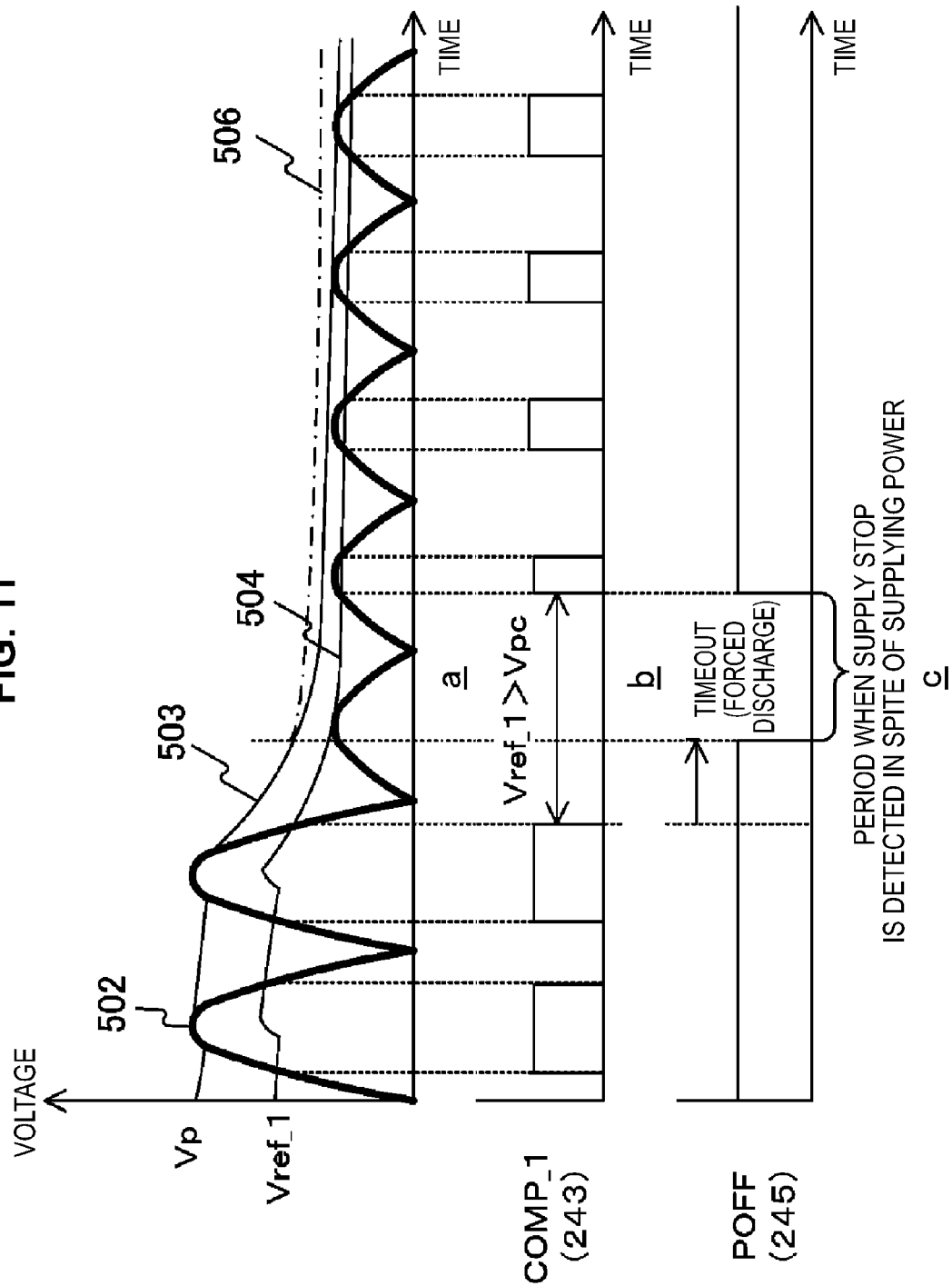
FIG. 11 is a timing chart illustrating one example of operation of the power supply monitoring circuit according to the first embodiment in sudden change of amplitude.

FIG. 11 is a timing chart illustrating one example of operation of the power supply monitoring circuit according to the first embodiment in sudden change of the amplitude. In FIG. 11, the vertical axes represent voltage and the horizontal axes represent time. Portion a in FIG. 11 illustrates one example of tracks of the power supply voltage Vpc, peak value Vp and reference value Vref_1 in sudden change of the amplitude. Tracks 502, 503 and 504 are one example of tracks of the power supply voltage Vpc, peak value Vp and reference value Vref_1, respectively. When the amplitude of the power supply voltage Vpc declines, the peak value Vp takes time to some extent to decrease down to the value equal to the amplitude after that decline. This time depends on the capacity of the peak value holding capacitor 213, potential difference between amplitudes before and after the decline and the like. This also applies to the reference value Vref_1 which is the value according to the peak value.

Portion b in FIG. 11 presents one example of timing of change of the comparison result COMP_1 from the comparator 243. The comparison result COMP_1 is at the low level in case where the value of the power supply voltage Vpc is smaller than the reference value Vref_1 and at the high level in the other case.

Portion c in FIG. 11 presents one example of timing of change of the power stop detection signal POFF from the power stop detection circuit 245. The power stop detection signal POFF is at the low level when the state that the comparison result COMP_1 is at the low level continues longer than a predetermined period.

When the decrease of the reference value Vref_1 is slower relative to the decline of the amplitude, the period when the value of the power supply voltage Vpc is smaller than the reference value Vref_1 (COMP_1=0) becomes longer, causing timeout. Hence, as illustrated in portion c of FIG. 11, supply stop of AC power is subject to misdetection.

Herein, a track 506 is a track of the peak value in case where the peak value holding capacitor 213 does not undergo forced discharge after the timeout. Supposing that forced discharge is not performed after the timeout, the decrease rate of the peak value is lower compared with the case of the forced discharge, causing a longer period of the misdetection of supply stop of AC power.

On the contrary, the forced discharge of the peak value holding capacitor 213 after the timeout leads to higher decrease rates of the peak value and the reference value Vref_1 compared with the case of no forced discharge. As a result, the period when the supply stop of AC power is subject to misdetection in supplying power is reduced.

Figure 12:
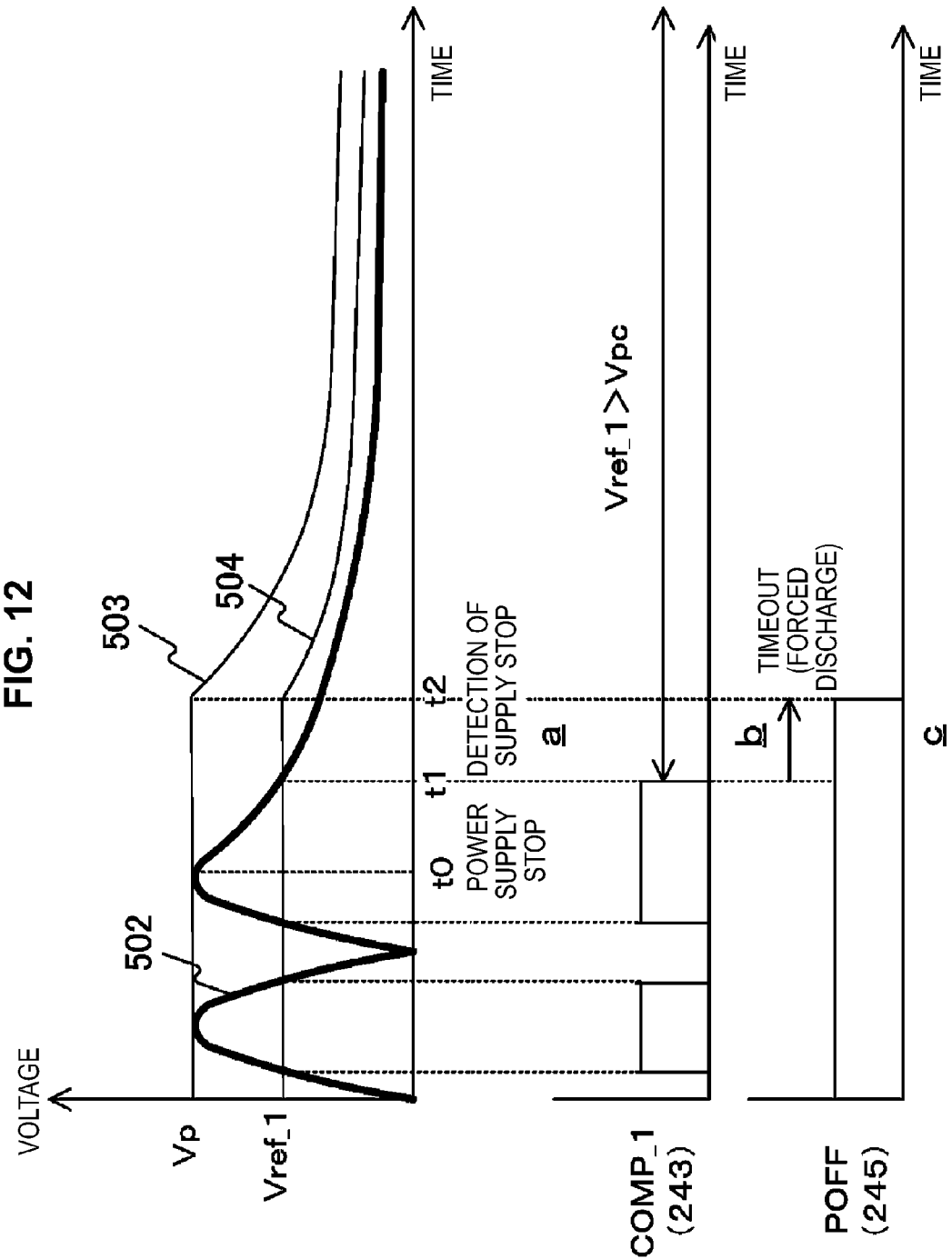
FIG. 12 is a timing chart illustrating one example of operation of the power supply monitoring circuit according to the first embodiment in supply stop of power.

FIG. 12 is a timing chart illustrating one example of operation of the power supply monitoring circuit according to the first embodiment in supply stop of the power. In FIG. 12, the vertical axes represent voltage and the horizontal axes represent time. Portion a in FIG. 12 illustrates one example of tracks of the power supply voltage Vpc, peak value Vp and reference value Vref_1 in supply stop of the power. Tracks 502, 503 and 504 are one example of tracks of the power supply voltage Vpc, peak value Vp and reference value Vref_1, respectively. When the power supply is stopped at time t0, the power supply voltage Vpc declines gradually after time t0.

Since the peak value Vp is held in the peak value holding capacitor 213, even after the decline of the power supply voltage Vpc after time t0, it holds the value before the decline for a while. Then, when the supply stop of AC power is detected at time t2, forced discharge of the peak value holding capacitor 213 is started and the peak value Vp decreases gradually after time t2. Also, the reference value Vref_1 according to the peak value Vp decreases gradually after time t2 similarly to the peak value.

Portion b in FIG. 12 presents one example of timing of change of the comparison result COMP_1 from the comparator 243. After time t0, the power supply voltage Vpc declines gradually, and at time t1, the value of the power supply voltage Vpc becomes smaller than the reference value Vref_1. At this stage, COMP_1 becomes at the low level. After time t1, since the value of the power supply voltage Vpc maintains to be smaller than the reference value Vref_1, COMP_1 maintains to be at the low level.

Portion c in FIG. 12 presents one example of timing of change of the power stop detection signal POFF from the power stop detection circuit 245. At time t2 when the state that the comparison result COMP_1 is at the low level has continued longer than a predetermined period after time t1, the power stop detection signal POFF is set at the low level indicating the supply stop of AC power.

As exemplarily illustrated in FIG. 12, when the power supply is stopped, the declining value of the power supply voltage Vpc is compared with the reference value Vref_1 according to the peak value. Thereby, the power supply monitoring circuit 200 can detect supply stop of AC power quickly.

Figure 13:
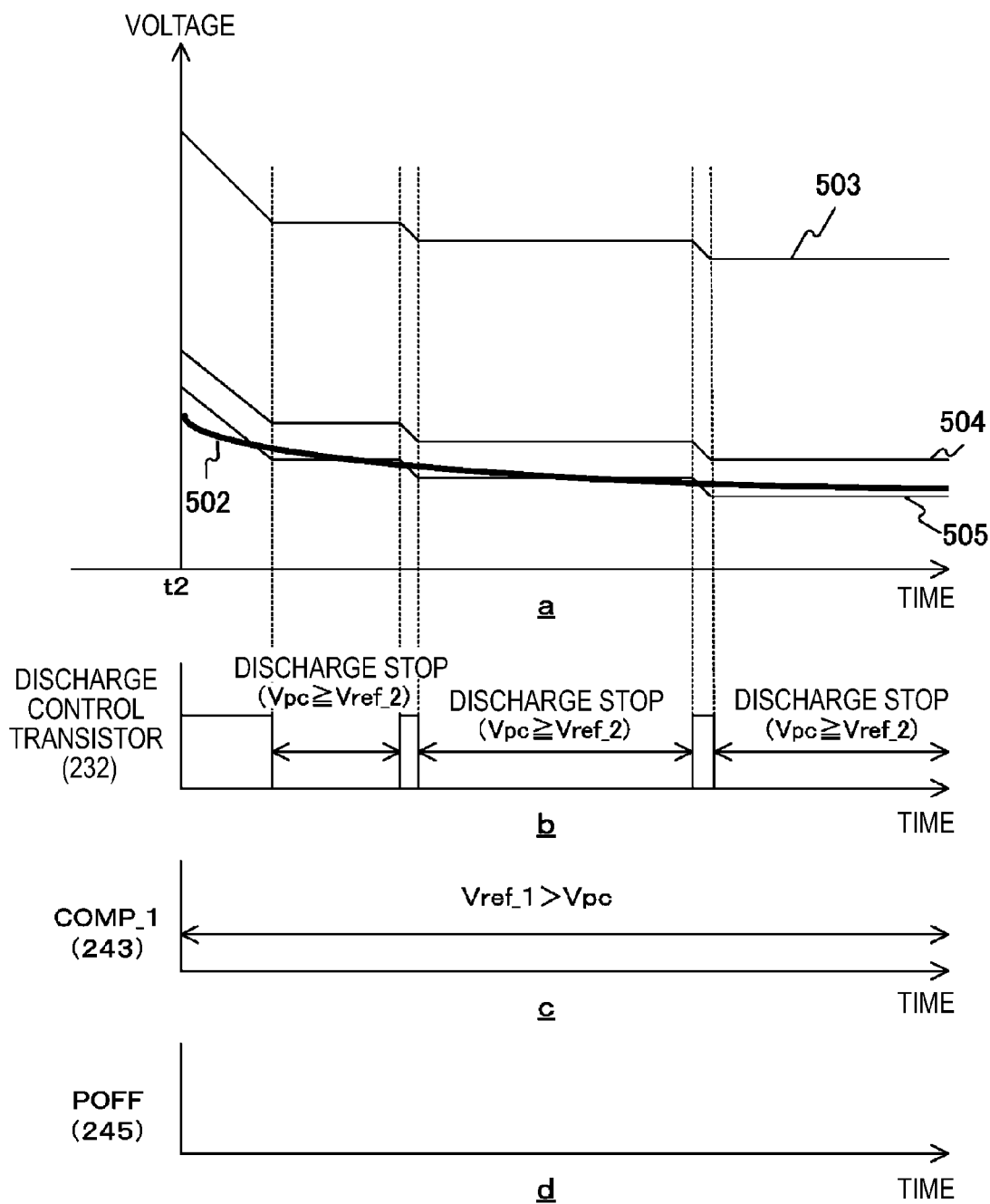
FIG. 13 is a timing chart illustrating one example of operation of the power supply monitoring circuit according to the first embodiment after detection of the supply stop of the power.

FIG. 13 is a timing chart illustrating one example of operation of the power supply monitoring circuit 200 according to the first embodiment after the detection of supply stop of the power. In FIG. 13, the vertical axes represent voltage and the horizontal axes represent time. Portion a in FIG. 13 illustrates one example of tracks of the power supply voltage Vpc, peak value Vp, reference value Vref_1 and reference value Vref_2 after time t2 when the supply stop of AC power is detected. Tracks 502, 503, 504 and 505 are one example of tracks of the power supply voltage Vpc, peak value Vp, reference value Vref_1 and reference value Vref_2, respectively.

As illustrated in portion a of FIG. 13, after the detection of supply stop of the power, due to the forced discharge of the peak value holding capacitor 213, the peak value Vp decreases quickly. Moreover, according to the decrease of the peak value Vp, the reference value Vref_1 and reference value Vref_2 also decrease quickly.

Herein, it is supposed that, although the decrease rate of the peak value Vp is larger than the decline rate of the power supply voltage Vpc, the power supply monitoring circuit 200 continued the forced discharge. In this case, sooner or later, the power supply voltage Vpc becomes equal to or greater than the reference value Vref_1, resulting in detection of no supply stop of the power. Upon detection of power supply, while the forced discharge is stopped, the power supply voltage Vpc continues to decline, resulting in detection of the supply stop of AC power again. After that, the supply stop of AC power and the supply of the power are detected alternately, causing the unstable potential of the power stop detection signal POFF. Although the state converges at the detection of supply stop of AC power eventually, the detection of supply stop of AC power delays by the time for the convergence.

However, when the reference value Vref_2 larger than the reference value Vref_1 becomes equal to or smaller than the value of the power supply voltage Vpc, the power supply monitoring circuit 200 stops the forced discharge not to decrease the peak value Vp. Therefore, the reference value Vref_1 is prevented from being equal to or smaller than the power supply voltage Vpc. As a result, detection of supply of the power supply voltage Vpc in spite of supply stop of the power supply voltage Vpc can be prevented and detection rate of supply stop of AC power becomes fast.

Portion b in FIG. 13 presents one example of timing of operation of the discharge control transistor 232. As exemplarily illustrated in portion b of FIG. 13, when the value of the power supply voltage Vpc becomes equal to or smaller than the reference value Vref_2, the discharge control transistor 232 is turned to the OFF state and the forced discharge is stopped.

Portion c in FIG. 13 presents one example of timing of change of the comparison result COMP_1 from the comparator 243. Moreover, portion d in FIG. 13 presents one example of timing of change of the power stop detection signal POFF from the power stop detection circuit 245. After time t2, since the forced discharge is performed such that the reference value Vref_1 does not become equal to or smaller than the power supply voltage Vpc, the reference value Vref_1 is larger than the power supply voltage Vpc quite frequently. As a result, the comparison result COMP_1 and power stop detection signal POFF maintain to be at the low level.

As above, according to the first embodiment of the present technology, since the power supply monitoring circuit 200 does not decrease the reference value Vref_1 when the value of the power supply voltage Vpc is equal to or greater than the reference value Vref_2, supply stop of the power supply voltage Vpc can be detected accurately and quickly. For example, supposing that the power supply monitoring circuit 200 decreases the reference value Vref_1 continuously when the decrease rate of the reference value Vref_1 is larger than the decline rate of the power supply voltage Vpc, there is sometimes a case where the value of the power supply voltage Vpc becomes equal to or greater than the reference value Vref_1. This case results in misdetection of no supply stop of AC power in supply stop of the power. However, since the power supply monitoring circuit 200 does not decrease the reference value Vref_1 when the value of the power supply voltage Vpc is equal to or greater than the reference value Vref_2 smaller than the reference value Vref_1, the power supply voltage Vpc can be prevented from being equal to or greater than the reference value Vref_1. As a result, it can be prevented that no supply stop of AC power is detected in spite of supply stop of the power and the supply stop of the power can be detected accurately and quickly.

2. Second Embodiment

[Configuration Example of Power Supply System]

Figure 14:
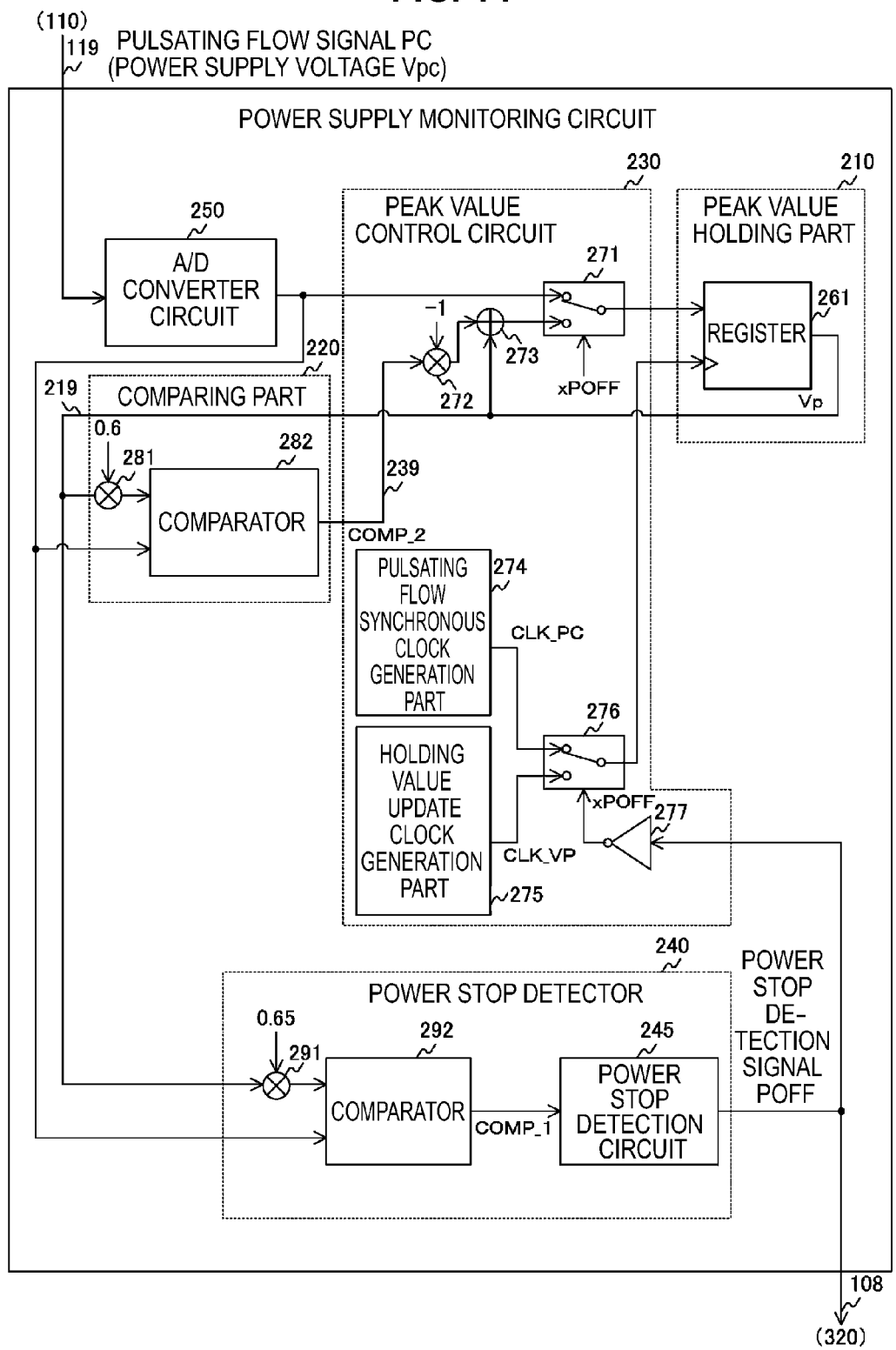
FIG. 14 is a circuit diagram illustrating one exemplary configuration of the power supply monitoring circuit according to a second embodiment.

FIG. 14 is a circuit diagram illustrating one exemplary configuration of the power supply monitoring circuit 200 according to a second embodiment. Other circuits other than the power stop detection circuit 245 are analog circuits in the first embodiment, whereas a part or entirety of these circuits may be digital circuits. The power supply monitoring circuit 200 according to the second embodiment is different from that according to the first embodiment from implementing the functions of the analog circuits by digital circuits.

Specifically, the power supply monitoring circuit 200 according to the second embodiment further includes an A/D converter circuit 250. The A/D converter circuit 250 converts the analog power supply voltage Vpc into a digital signal to supply to the comparing part 220, peak value control circuit 230 and power stop detector 240.

Moreover, the peak value holding part 210 includes a register 261. The register 261 holds the peak value Vp. The register 261 is synchronized with a pulsating flow synchronous clock CLK_PC to hold the value of the power supply voltage Vpc from the A/D converter circuit 250 as the peak value. Moreover, the register 261 is synchronized with a holding value synchronous clock CLK_VP to hold a value smaller than the previous peak value as a new peak value. Hereafter, newly holding a different peak value in place of a previous peak value is referred to as "updating" a peak value. Herein, the pulsating flow synchronous clock CLK_PC is a clock signal synchronizing with the pulsating flow signal PC. For example, the pulsating flow synchronous clock CLK_PC is a signal changing in value when the voltage of the pulsating flow signal PC is at its local maximum. Moreover, the holding value synchronous clock CLK_VP is a clock signal higher in frequency than the pulsating flow synchronous clock CLK_PC.

The peak value control circuit 230 includes a selector 271, a multiplier 272, an adder 273, a pulsating flow synchronous clock generation part 274, a holding value update clock generation part 275, a selector 276 and an inverter 277.

The selector 271 selects any of the power supply voltage Vpc and a signal from the adder 273 to output according to an inversion signal xPOFF obtained by inverting the power stop detection signal POFF. The selector 271 has two input terminals and one output terminal. One of the two input terminals is connected to the A/D converter circuit 250 and the other is connected to the adder 273. The output terminal of the selector 271 is connected to the register 261. When the inversion signal xPOFF is at the low level, the selector 271 selects the power supply voltage Vpc from the A/D converter circuit 250 to output to the register 261. On the other hand, when the inversion signal xPOFF is at the high level, the selector 271 outputs the signal from the adder 273 to the register 261.

The multiplier 272 multiplies the comparison result COMP_2 from the comparing part 220 by a predetermined coefficient A. Herein, the coefficient A is a negative real number, for example, "−1". The value of the comparison result COMP_2 can be a value of "1" or "0". Therefore, when the value A is "4", the value obtained by the multiplication is "−1" or "0". The multiplier 272 outputs the value obtained by the multiplication to the adder 273 as the multiplication result.

The adder 273 adds the multiplication result from the multiplier 272 to the peak value Vp held in the register 261. The adder 273 outputs the addition result to the input terminal of the selector 271.

The pulsating flow synchronous clock generation part 274 employs a PLL circuit and the like to generate the pulsating flow synchronous clock CLK_PC. The holding value update clock generation part 275 employs a PLL circuit and the like to generate the holding value update clock CLK_VP.

The selector 276 selects any of the pulsating flow synchronous clock CLK_PC and holding value update clock CLK_VP to output according to the inversion signal xPOFF. The selector 276 has two input terminals and one output terminal. One of the two input terminals is connected to the pulsating flow synchronous clock generation part 274 and the other is connected to the holding value update clock generation part 275. The output terminal of the selector 271 is connected to the enable terminal of the register 261. When the inversion signal xPOFF is at the low level, the selector 276 selects the pulsating flow synchronous clock CLK_PC to output to the register 261, and the other hand, when the inversion signal xPOFF is at the high level, the selector 276 outputs the holding value update clock CLK_VP to the register 261.

The inverter 277 inverts the power stop detection signal POFF, and thereby, generates the inversion signal xPOFF. The inverter 277 outputs the inversion signal xPOFF to the selectors 271 and 276.

The comparing part 220 includes a multiplier 281 and a comparator 282. The multiplier 281 multiplies the peak value Vp held in the register 261 by a predetermined coefficient B. The coefficient is a real number less than 1 and is, for example, 0.6. The multiplier 281 outputs the multiplication result to the comparator 282 as the reference value Vref_2.

The comparator 282 compares the reference value Vref_2 from the multiplier 281 with the value of the power supply voltage Vpc from the A/D converter circuit 250. The comparator 282 outputs the comparison result to the multiplier 272 as the comparison result COMP_2. Specifically, in case where the value of the power supply voltage Vpc is larger than the reference value Vref_2, the comparison result COMP_2 with a value of "1" is outputted, and in the other case, the comparison result COMP_2 with a value of "0" is outputted.

The power stop detector 240 includes a multiplier 291, a comparator 292 and a power stop detection circuit 245. The multiplier 291 multiplies the peak value Vp held in the register 261 by a predetermined coefficient C. The coefficient C is a real number larger than the value B and less than 1 and is, for example, 0.65. The multiplier 281 outputs the multiplication result to the comparator 292 as the reference value Vref_1.

The comparator 292 compares the reference value Vref_1 from the multiplier 291 with the value of the power supply voltage Vpc from the A/D converter circuit 250. The comparator 292 outputs the comparison result to the power stop detection circuit 245 as the comparison result COMP_1. Specifically, in case where the value of the power supply voltage Vpc is larger than the reference value Vref_1, the comparison result COMP_1 at the high level is outputted, and in the other case, the comparison result COMP_1 at the low level is outputted. The power stop detection circuit 245 according to second embodiment is configured similarly to the first embodiment.

In supplying power, that is, in case where the power stop detection signal POFF is at the high level, the selector 276 selects the pulsating flow synchronous clock CLK_PC and the selector 271 selects the power supply voltage Vpc. Since the register 261 is updated synchronously with the pulsating flow synchronous clock CLK_PC which changes upon the pulsating flow being at its local maximum, the register 261 holds the local maximum value of the power supply voltage Vpc as the peak value.

On the other hand, when the supply of the power is stopped, that is, in case where the power stop detection signal POFF is at the low level, the selector 276 selects the holding value update clock CLK_VP and the selector 271 selects the signal from the adder 273.

Herein, when the value of the power supply voltage Vpc is larger than the reference value Vref_2, the value of the comparison result COMP_2 is "1" and the multiplication result of the multiplier 272 is "−1". Accordingly, the adder 273 outputs the value obtained by subtracting "1" from the peak value, and the register 261 holds it via the selector 271. This processing is performed synchronously with the holding value update clock CLK_VP and the peak value Vp decreases gradually.

On the other hand, when the value of the power supply voltage Vpc is equal to or smaller than the reference value Vref_2, the value of the comparison result COMP_2 is "0" and the multiplication result of the multiplier 272 is "0". Accordingly, the adder 273 outputs the peak value Vp as it is and the peak value Vp is not updated.

Figure 15:
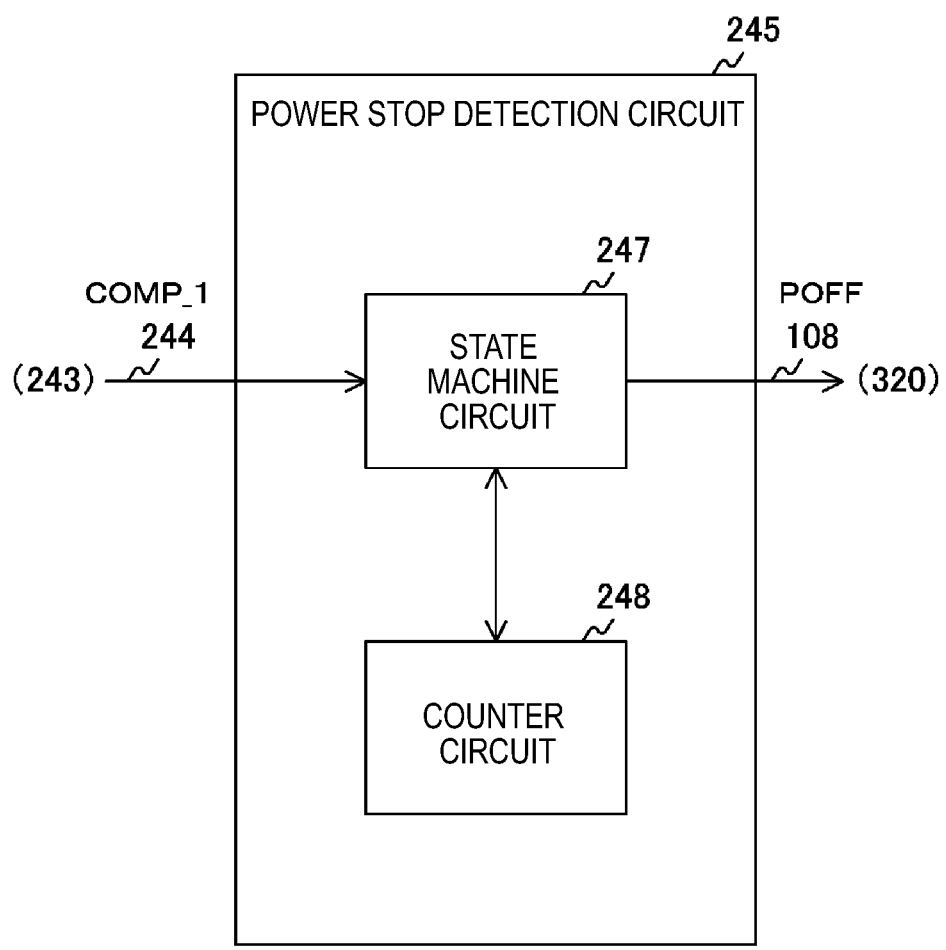
FIG. 15 is a block diagram illustrating one exemplary configuration of the power stop detection circuit according to the second embodiment.

FIG. 15 is a block diagram illustrating one exemplary configuration of the power stop detection circuit 245 according to the second embodiment. The power stop detection circuit 245 according to the second embodiment does not include the sampling circuit 246 and the comparison result COMP_1 is inputted in the state machine circuit 247 not via the sampling circuit 246, being similar to first embodiment except these.

As above, according to the second embodiment of the present technology, the power supply monitoring circuit 200 can include the register 261 in place of the peak value holding capacitor 213. Moreover, the power supply monitoring circuit 200 can include the comparators (element 282 and the like) as digital circuits in place of the analog comparators (element 221 and the like). Furthermore, the power supply monitoring circuit 200 can include the multipliers (element 291 and the like) multiplying the value of the voltage by a voltage-division ratio in place of the resistors (elements 241 and 242 and the like) for voltage-division on the voltage by a voltage-division ratio. In general, a digital circuit is small in size, high in accuracy and easy to design as merits compared with an analog circuit having the same function. Therefore, such substitution for digital circuits enables the power supply monitoring circuit 200 to be small in size and to monitor AC power supply accurately. Moreover, design costs can be reduced.

3. Third Embodiment

[Configuration Example of Power Supply Monitoring Circuit]

Figure 16:
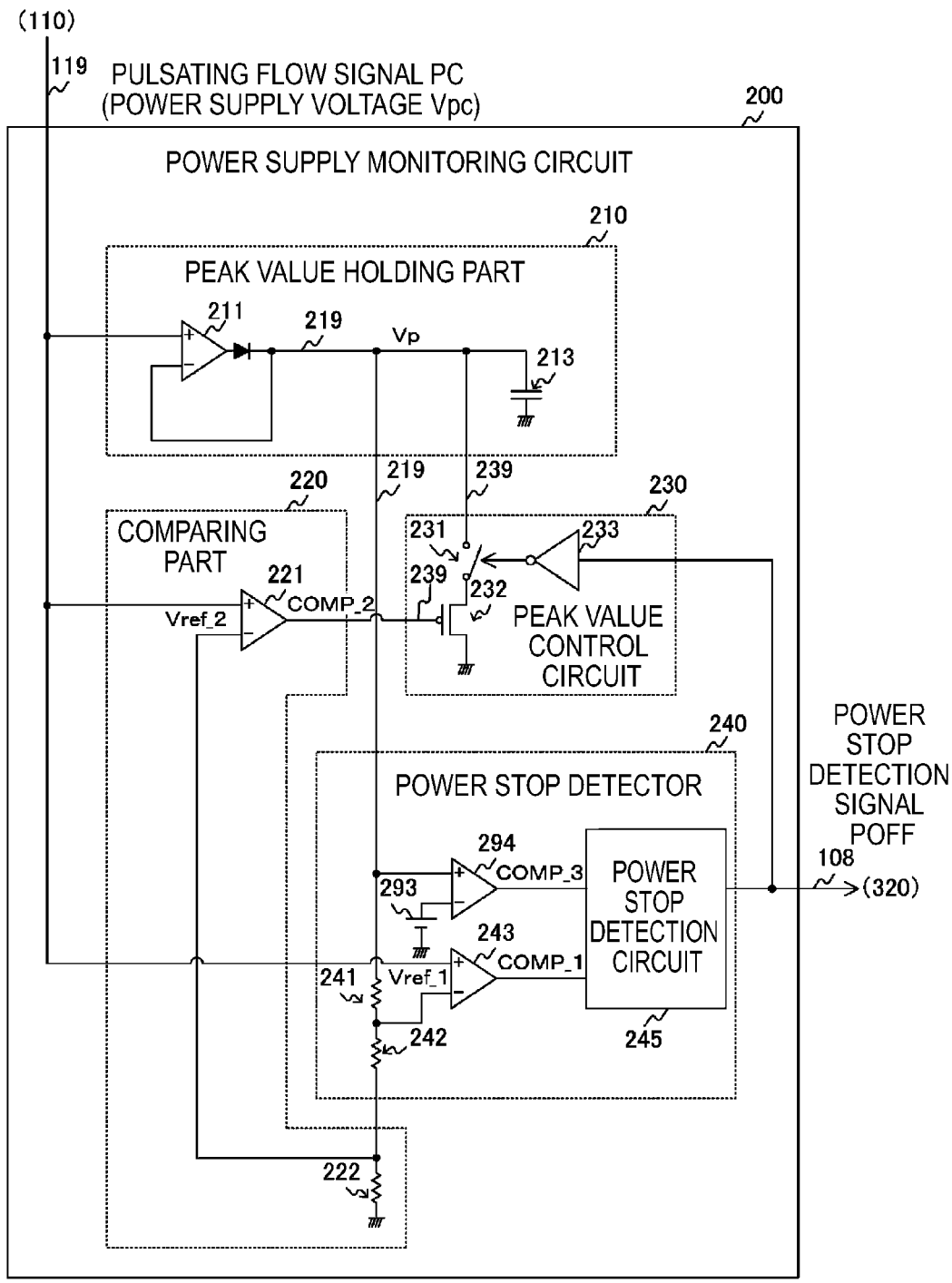
FIG. 16 is a circuit diagram illustrating one exemplary configuration of the power supply monitoring circuit according to a third embodiment.

FIG. 16 is a circuit diagram illustrating one exemplary configuration of the power supply monitoring circuit 200 according to a third embodiment. In the first embodiment, supply stop of AC power is not detected when the amplitude of the power supply voltage Vpc declines with its fluctuation, based on this, power supply being determined. However, in case where the amplitude of the power supply voltage Vpc declines down to less than the lowest operation voltage of the electronic equipment 400, the power supply is substantially regarded as being stopped. The power supply monitoring circuit 200 according to the third embodiment detects supply stop of AC power even when the amplitude of the power supply voltage Vpc declines less than the lowest operation voltage of the electronic equipment 400, this being different from the first embodiment. Specifically, the power supply monitoring circuit 200 according to the third embodiment further includes a lowest operation voltage value supply source 293 and a comparator 294 in the power stop detector 240, this being different from the first embodiment.

The lowest operation voltage value supply source 293 supplies a lowest operation voltage value Vmin to the inversion input terminal of the comparator 294. The comparator 294 compares the lowest operation voltage value Vmin with the peak value Vp. The signal line 219 is connected to the non-inversion input terminal of the comparator 294 and the lowest operation voltage value supply source 293 is connected to the inversion input terminal thereof. The output terminal of the comparator 294 is connected to the power stop detection circuit 245. The comparator 294 outputs the comparison result of the lowest operation voltage value Vmin with the peak value Vp as a comparison result COMP_3. For example, in case where the peak value Vp is larger than the lowest operation voltage value Vmin which is a threshold, the comparison result COMP_3 at the high level is outputted, and in the other case, the comparison result COMP_3 at the low level is outputted.

When the state that the comparison result COMP_1 is at the low level is longer than a predetermined period or when the comparison result COMP_3 is at the low level, the power stop detection circuit 245 outputs the power stop detection signal POFF at the low level.

[Operation Example of Power Supply Monitoring Circuit]

Figure 17:
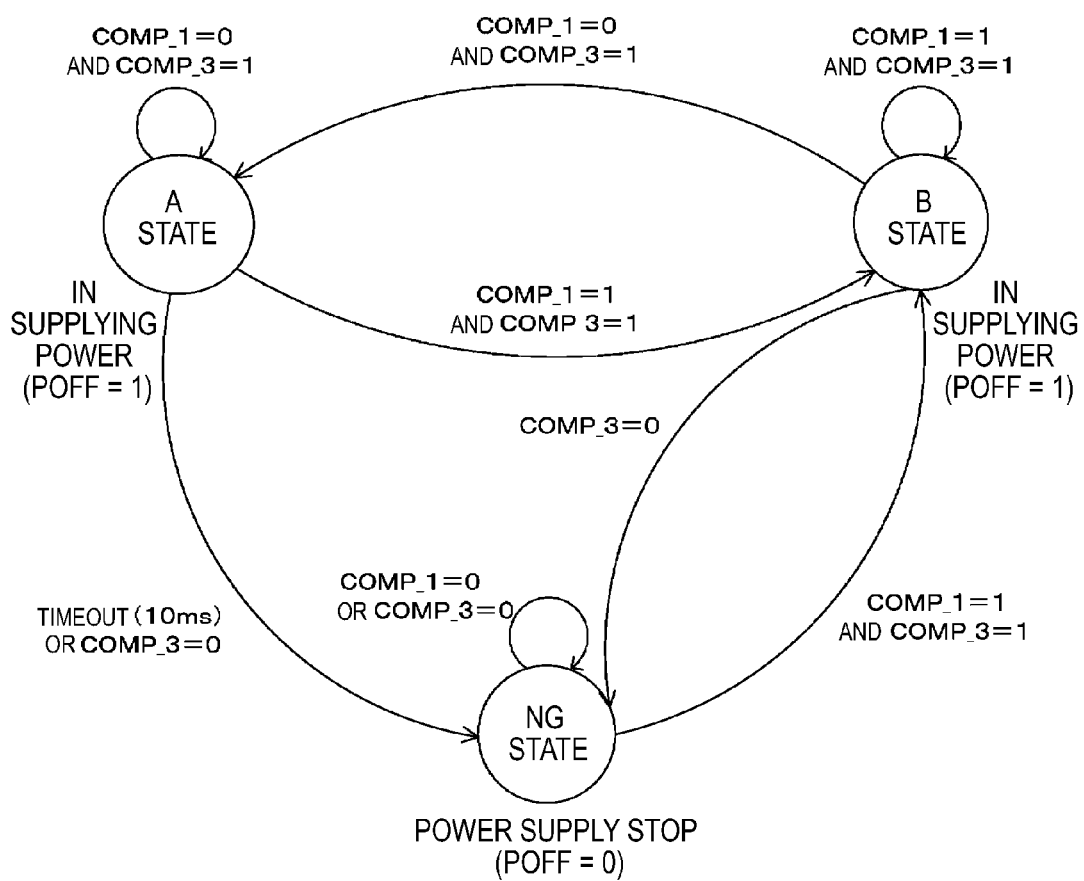
FIG. 17 is a state transition diagram illustrating one example of operation of the state machine circuit according to the third embodiment.

FIG. 17 is a state transition diagram illustrating one example of operation of the state machine circuit 247 according to the third embodiment.

In the A state, when the comparison result COMP_1 is at the low level and the comparison result COMP_3 is at the high level, the state machine circuit 247 maintains the A state and causes the counter circuit 248 to count a period when being in the A state. When the comparison results COMP_1 and COMP_3 are at the high level, the state machine circuit 247 moves to the B state. In case of timeout or the comparison result COMP_3 being at the low level, the state machine circuit 247 moves to the NG state.

In the B state, when the comparison results COMP_1 and COMP_3 are at the high level, the state machine circuit 247 maintains the B state. When the comparison result COMP_1 is at the low level and the comparison result COMP_3 is at the high level, the state machine circuit 247 moves to the A state. Moreover, when the comparison result COMP_3 is at the low level, the state machine circuit 247 moves to the NG state.

In the NG state, the state machine circuit 247 sets the power stop detection signal POFF to the low level. When the comparison result COMP_1 or the comparison result COMP_3 is at the low level, the state machine circuit 247 maintains the NG state. When the comparison results COMP_1 and COMP_3 are both at the high level, the state machine circuit 247 moves to the B state.

As above, according to the third embodiment of the present technology, the power supply monitoring circuit 200 can detect supply stop of the power when the amplitude of the power supply voltage Vpc is less than the lowest operation voltage. Thereby, supply stop of AC power is securely detected when, although the power supply voltage Vpc fluctuates, its amplitude does not reach the lowest operation voltage, not resulting in faulty detection of supply stop of AC power as in the first or second embodiment.

Note that the above described embodiments show examples of embodying the present disclosure, and there is a correspondence between the features in the embodiments and the respective features of the present disclosure. Similarly, there is a correspondence between the features of the present disclosure and the respective features in the embodiments of the present disclosure with the same reference numerals. However, the present disclosure is not limited to the embodiments, and can embody various modifications which do not deviate from the scope of the present disclosure.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A power supply monitoring circuit including:
 a holding part holding, every time a local maximum value of a power supply voltage which fluctuates is detected, the local maximum value as a local maximum voltage value;
 a power stop detector detecting whether or not supply of the power supply voltage is stopped based on whether or not a state that a value of the power supply voltage is smaller than a first reference value according to the local maximum voltage value continues longer than a predetermined period; and
 a reference value controller decreasing the first reference value during a period in which the value of the power supply voltage exceeds a second reference value smaller than the first reference value and in which stop of the supply of the power supply voltage is detected.

(2) The power supply monitoring circuit according to (1),
 wherein the holding part includes a capacitor holding the local maximum voltage value, and
 wherein the reference value controller decreases the first reference value by discharging the capacitor.

(3) The power supply monitoring circuit according to (1),
 wherein the first reference value is a value at which a ratio relative to the local maximum voltage value is a first ratio, and wherein the second reference value is a value at which a ratio relative to the local maximum voltage value is a second ratio smaller than the first ratio.

(4) The power supply monitoring circuit according to any one of (1) to (3),
wherein the power stop detector includes
a power stop detection comparator comparing the value of the power supply voltage with the first reference value to output a result of the comparison as a first comparison result, and
a power stop detection circuit detecting whether or not the supply of the power supply voltage is stopped based on whether or not an output of the first comparison result indicating that the value of the power supply voltage is smaller than the first reference value continues longer than the predetermined period.

(5) The power supply monitoring circuit according to any one of (1) to (4),
wherein the reference value controller includes
a local maximum voltage value control comparator comparing the value of the power supply voltage with the second reference value to output a result of the comparison as a second comparison result, and
a reference value control circuit decreasing the first reference value during a period in which the second comparison result indicating that the value of the power supply voltage is larger than the second reference value is outputted and in which the stop of the supply of the power supply voltage is detected.

(6) The power supply monitoring circuit according to any one of (1) to (5),
wherein the holding part includes
a register holding the local maximum voltage value, and
wherein a local maximum voltage value controller decreases the first reference value by decreasing the local maximum voltage value read out from the register to update the register with the decreased local maximum voltage value.

(7) The power supply monitoring circuit according to any one of (1) to (6),
wherein the reference value controller decreases the first reference value during a period in which the local maximum voltage value is smaller than a predetermined threshold or a period in which the value of the power supply voltage is larger than the second reference value and in which the stop of the supply of the power supply voltage is detected.

(8) An AC/DC conversion apparatus including:
a rectifier circuit generating a pulsating flow signal by rectifying an AC signal;
a holding part holding, every time a local maximum value of a power supply voltage as a voltage of the pulsating flow signal is detected, the local maximum value as a local maximum voltage value;
a power stop detector detecting whether or not supply of the power supply voltage is stopped based on whether or not a state that a value of the power supply voltage is smaller than a first reference value according to the local maximum voltage value continues longer than a predetermined period; and
a reference value controller decreasing the first reference value during a period in which the value of the power supply voltage exceeds a second reference value smaller than the first reference value and in which stop of the supply of the power supply voltage is detected.

(9) A control method of a power supply monitoring circuit, including:
detecting, by a power stop detector, whether or not supply of a power supply voltage is stopped based on whether or not a state continues longer than a predetermined period, the state being that a value of the power supply voltage is smaller than a first reference value according to a local maximum voltage value which is held by a holding part holding, every time a local maximum value of the power supply voltage which fluctuates is detected, the local maximum value as the local maximum voltage value; and
decreasing, by a reference value controller, the first reference value during a period in which the value of the power supply voltage exceeds a second reference value smaller than the first reference value and in which stop of the supply of the power supply voltage is detected.

The present disclosure contains subject matter related to that disclosed in Japanese Priority Patent Application JP 2012-171700 filed in the Japan Patent Office on Aug. 2, 2012, the entire content of which is hereby incorporated by reference.

What is claimed is:

1. A power supply monitoring circuit comprising:
a holding part holding, every time a local maximum value of a power supply voltage which fluctuates is detected, the local maximum value as a local maximum voltage value;
a power stop detector detecting whether or not supply of the power supply voltage is stopped based on whether or not a state that a value of the power supply voltage is smaller than a first reference value according to the local maximum voltage value continues longer than a predetermined period; and
a reference value controller decreasing the first reference value during a period in which the value of the power supply voltage exceeds a second reference value smaller than the first reference value and in which stop of the supply of the power supply voltage is detected.

2. The power supply monitoring circuit according to claim 1,
wherein the holding part includes a capacitor holding the local maximum voltage value, and
wherein the reference value controller decreases the first reference value by discharging the capacitor.

3. The power supply monitoring circuit according to claim 1,
wherein the first reference value is a value at which a ratio relative to the local maximum voltage value is a first ratio, and
wherein the second reference value is a value at which a ratio relative to the local maximum voltage value is a second ratio smaller than the first ratio.

4. The power supply monitoring circuit according to claim 1,
wherein the power stop detector includes
a power stop detection comparator comparing the value of the power supply voltage with the first reference value to output a result of the comparison as a first comparison result, and
a power stop detection circuit detecting whether or not the supply of the power supply voltage is stopped based on whether or not an output of the first comparison result indicating that the value of the power supply voltage is smaller than the first reference value continues longer than the predetermined period.

5. The power supply monitoring circuit according to claim 1,
wherein the reference value controller includes
a local maximum voltage value control comparator comparing the value of the power supply voltage with the second reference value to output a result of the comparison as a second comparison result, and a reference value control circuit decreasing the first reference value during a period in which the second comparison result indicating that the value of the power supply voltage is larger than the second reference value is outputted and in which the stop of the supply of the power supply voltage is detected.

6. The power supply monitoring circuit according to claim 1, wherein the holding part includes a register holding the local maximum voltage value, and wherein a local maximum voltage value controller decreases the first reference value by decreasing the local maximum voltage value read out from the register to update the register with the decreased local maximum voltage value.

7. The power supply monitoring circuit according to claim 1, wherein the reference value controller decreases the first reference value during a period in which the local maximum voltage value is smaller than a predetermined threshold or a period in which the value of the power supply voltage is larger than the second reference value and in which the stop of the supply of the power supply voltage is detected.

8. An AC/DC conversion apparatus comprising:

a rectifier circuit generating a pulsating flow signal by rectifying an AC signal;

a holding part holding, every time a local maximum value of a power supply voltage as a voltage of the pulsating flow signal is detected, the local maximum value as a local maximum voltage value;

a power stop detector detecting whether or not supply of the power supply voltage is stopped based on whether or not a state that a value of the power supply voltage is smaller than a first reference value according to the local maximum voltage value continues longer than a predetermined period; and a reference value controller decreasing the first reference value during a period in which the value of the power supply voltage exceeds a second reference value smaller than the first reference value and in which stop of the supply of the power supply voltage is detected.

9. A control method of a power supply monitoring circuit, comprising:

detecting, by a power stop detector, whether or not supply of a power supply voltage is stopped based on whether or not a state continues longer than a predetermined period, the state being that a value of the power supply voltage is smaller than a first reference value according to a local maximum voltage value which is held by a holding part holding, every time a local maximum value of the power supply voltage which fluctuates is detected, the local maximum value as the local maximum voltage value; and decreasing, by a reference value controller, the first reference value during a period in which the value of the power supply voltage exceeds a second reference value smaller than the first reference value and in which stop of the supply of the power supply voltage is detected.

* * * * *